(12) United States Patent
Lee et al.

(10) Patent No.: US 12,255,126 B2
(45) Date of Patent: Mar. 18, 2025

(54) SEMICONDUCTOR DEVICES INCLUDING SUBSTRATES BONDED TO EACH OTHER AND METHODS FOR FABRICATING THE SAME

(71) Applicant: SK hynix Inc., Icheon-si (KR)

(72) Inventors: Mi Seon Lee, Icheon-si (KR); Sung Kyu Kim, Icheon-si (KR); Jong Hoon Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 488 days.

(21) Appl. No.: 17/689,419

(22) Filed: Mar. 8, 2022

(65) Prior Publication Data

US 2023/0120361 A1      Apr. 20, 2023

(30) Foreign Application Priority Data

Oct. 15, 2021   (KR) ........................ 10-2021-0137913

(51) Int. Cl.
*H01L 23/48*    (2006.01)
*H01L 23/00*    (2006.01)
(Continued)

(52) U.S. Cl.
CPC ...... *H01L 23/481* (2013.01); *H01L 23/53238* (2013.01); *H01L 24/05* (2013.01);
(Continued)

(58) Field of Classification Search
CPC . H01L 23/481; H01L 23/53238; H01L 24/05; H01L 24/08; H01L 24/80; H01L 2224/05647; H01L 2224/08146; H01L 2224/80895; H01L 2224/80896; H01L 2924/05042; H01L 25/0657;
(Continued)

(56) References Cited

U.S. PATENT DOCUMENTS

| 10,541,230 B2 * | 1/2020 | Higuchi ................. H01L 24/03 |
| 2015/0061120 A1 * | 3/2015 | Yang ...................... H01L 24/97 |
| | | 257/737 |

(Continued)

FOREIGN PATENT DOCUMENTS

| CN | 103021987 A | * | 4/2013 | ....... H01L 21/76898 |
| KR | 1020120105853 A |  | 9/2012 | |

*Primary Examiner* — Niki H Nguyen
(74) *Attorney, Agent, or Firm* — WILLIAM PARK & ASSOCIATES LTD.

(57) ABSTRACT

There are provided a semiconductor and a method of fabricating the same. The semiconductor device may include a second semiconductor substrate directly bonded to a first semiconductor substrate. The first semiconductor substrate may include a first through via with an end portion protruding through a first top surface, the first top surface being a top surface of a first semiconductor substrate body, a liner extending to partially expose a side surface of the end portion of the first through via, and a first diffusion barrier layer. The liner may include a third top surface that is positioned at a lower height than a second top surface, the second top surface being a top surface of the end portion of the first through via and substantially equal to the first top surface. Alternatively, the liner may include a third surface positioned at a height that is lower than the second top surface and higher than the first top surface.

24 Claims, 27 Drawing Sheets

(51) Int. Cl.
  *H01L 23/52*    (2006.01)
  *H01L 23/532*   (2006.01)
  *H01L 29/40*    (2006.01)

(52) U.S. Cl.
  CPC .............. *H01L 24/08* (2013.01); *H01L 24/80* (2013.01); *H01L 2224/05647* (2013.01); *H01L 2224/08146* (2013.01); *H01L 2224/80895* (2013.01); *H01L 2224/80896* (2013.01); *H01L 2924/05042* (2013.01)

(58) Field of Classification Search
  CPC ..... H01L 21/76898; H01L 2225/06541; H01L 24/16; H01L 23/5226; H01L 23/49827; H01L 2224/08145; H01L 21/76831; H01L 21/76877; H01L 2224/13022; H01L 2224/16235; H01L 2224/1403; H01L 2224/80001; H01L 2224/95; H01L 2224/13009; H01L 2224/73204; H01L 2224/16145; H01L 24/06; H01L 2224/32145; H01L 2224/02372; H01L 2924/18161; H01L 25/0652; H01L 24/09; H01L 23/49822; H01L 21/823475; H01L 2224/14181; H01L 23/53295; H01L 2224/05009; H01L 24/97; H01L 25/0655; H01L 21/76897; H01L 21/823871; H01L 2224/81193; H01L 23/5384; H01L 2225/06548; H01L 2224/08; H01L 2224/16; H10B 10/00; H10B 43/35; H10B 41/35; H10B 69/00
  See application file for complete search history.

(56) References Cited

U.S. PATENT DOCUMENTS

2019/0139785 A1\* 5/2019 Lee .................. H01L 21/50
2019/0385935 A1 12/2019 Gao et al.

\* cited by examiner

SEMICONDUCTOR DEVICES INCLUDING SUBSTRATES BONDED TO EACH OTHER AND METHODS FOR FABRICATING THE SAME

CROSS-REFERENCE TO RELATED APPLICATIONS

The present application claims priority under 35 U.S.C 119(a) to Korean Applications No. 10-2021-0137913, filed on Oct. 15, 2021, which is incorporated herein by reference in its entirety.

BACKGROUND

1. Technical Field

The present disclosure generally relates to a semiconductor technology, and more particularly, to semiconductor devices including semiconductor substrates that are bonded to each other and stacked three-dimensionally and methods for fabricating the same.

2. Related Art

Semiconductor devices are used in various electronic applications. The semiconductor devices may be used in a personal computer, a mobile phone, a camera, or the like. A semiconductor device may be fabricated by processes of depositing a semiconductor material layer, conductive layers, dielectric layers, or insulation layers on a semiconductor substrate or semiconductor wafer and patterning those layers to form circuit components and elements, and processes of separating the semiconductor substrate or semiconductor wafer into individual dies and packaging the individual dies into packages. As the integration density of various electronic components increases and smaller-sized semiconductor devices are required, three-dimensional semiconductor devices have been recently developed. The 3D semiconductor devices are being developed in the form of a package such as a package on package (PoP) or a system in package (SiP).

SUMMARY

An embodiment of the present disclosure may present a semiconductor device including a first semiconductor substrate; and a second semiconductor substrate directly bonded to the first semiconductor substrate. The first semiconductor substrate may include a first semiconductor substrate body, a first through via with an end portion protruding through a first top surface, the first top surface being a top surface of the first semiconductor substrate body, a liner formed at an interface between the first through via and the first semiconductor substrate body and extending to partially expose a side surface of the end portion of the first through via, and a first diffusion barrier layer covering the first top surface of the semiconductor substrate body and covering the side surface of the end portion of the first through via. The liner may include a third top surface that is positioned at a lower position than a second top surface, the second top surface being a top surface of the end portion of the first through via and substantially equal to or at a higher position than the first top surface.

Another embodiment of the present disclosure may present a method of fabricating a semiconductor device including forming a first through via that is surrounded by a liner in a first semiconductor substrate body; first recessing the first semiconductor substrate body to allow an end portion of the first through via to protrude from a first recessed top surface of the first semiconductor substrate body while being covered by the liner; removing a portion that surrounds the end portion of the first through via of the liner to expose a portion of a side surface and second top surface of the end portion of the first through via; second recessing the first top surface of the first semiconductor substrate body; forming a first diffusion barrier layer that covers the second recessed first top surface of the first semiconductor substrate body and exposing the second top surface of the end portion of the first through via; and directly bonding a second semiconductor substrate to the first diffusion barrier layer and the second top surface of the end portion of the first through via.

Another embodiment of the present disclosure may present a semiconductor device including a first semiconductor substrate; and a second semiconductor substrate directly bonded to the first semiconductor substrate, wherein the first semiconductor substrate may include a first semiconductor substrate body; a first through via with an end portion protruding through a first top surface, the first top surface being a top surface of the first semiconductor substrate body; a liner disposed at an interface between the first through via and the first semiconductor substrate body and extending to partially expose a side surface of the end portion of the first through via; and a first diffusion barrier layer covering the first top surface of the semiconductor substrate body and covering the side surface of the end portion of the first through via, wherein the liner comprises an inclined third top surface that is positioned at a lower position than a second top surface, the second top surface being a top surface of the end portion of the first through via, and wherein the inclined third top surface comprises a first edge portion positioned at a higher position than the first top surface of the first semiconductor substrate body and a second edge portion opposite to the first edge portion positioned at a lower position than the first top surface of the first semiconductor substrate body.

DETAILED DESCRIPTION

Figure 1:
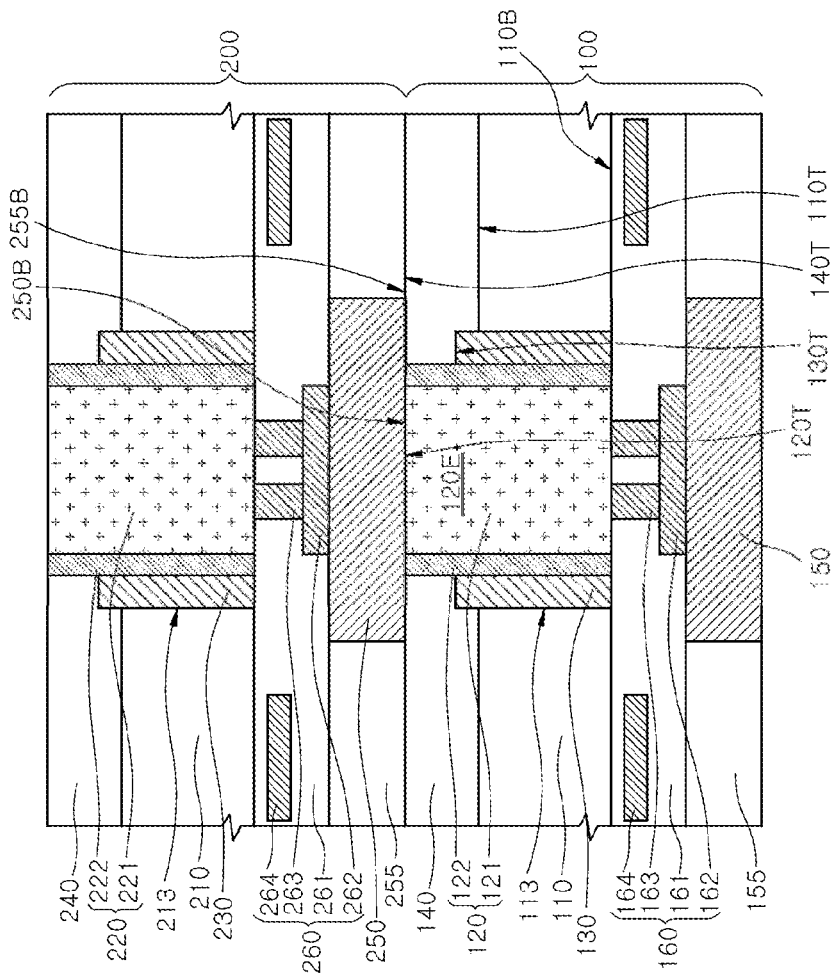
FIG. 1 is a schematic cross-sectional view illustrating a semiconductor device according to an embodiment of the present disclosure.

The terms used herein may correspond to words selected in consideration of their functions in presented embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms "first" and "second," "side," "top," and "bottom or lower" may be used herein to describe various devices, these devices should not be limited by these terms. These terms are only used to distinguish one device from another device, but not used to indicate a particular sequence or number of devices.

The semiconductor device may include a semiconductor substrate or a structure in which a plurality of semiconductor substrates are stacked. The semiconductor device may refer to a semiconductor package structure in which a structure in which semiconductor substrates are stacked is packaged. The semiconductor substrate may refer to a semiconductor wafer, a semiconductor die, or a semiconductor chip in which electronic components and devices are integrated. The semiconductor chip may refer to a memory chip in which memory integrated circuits, such as dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits, or phase change random access memory (PcRAM) are integrated, logic dies or ASIC chips in which logic circuits are integrated in a semiconductor substrate, or processors such as application processors (Aps), graphic processing units (GPUs), central processing units (CPUs) or system-on-chips (SoCs). The semiconductor device may be employed in information communication systems, such as mobile phones, electronic systems associated with biotechnology or health care, or wearable electronic systems. The semiconductor device may be applicable to internet of things (IoT).

Same reference numerals refer to same devices throughout the specification. Even though a reference numeral might not be mentioned or described with reference to a drawing, the reference numeral may be mentioned or described with reference to another drawing. In addition, even though a reference numeral might not be shown in a drawing, it may be shown in another drawing.

Figure 2:
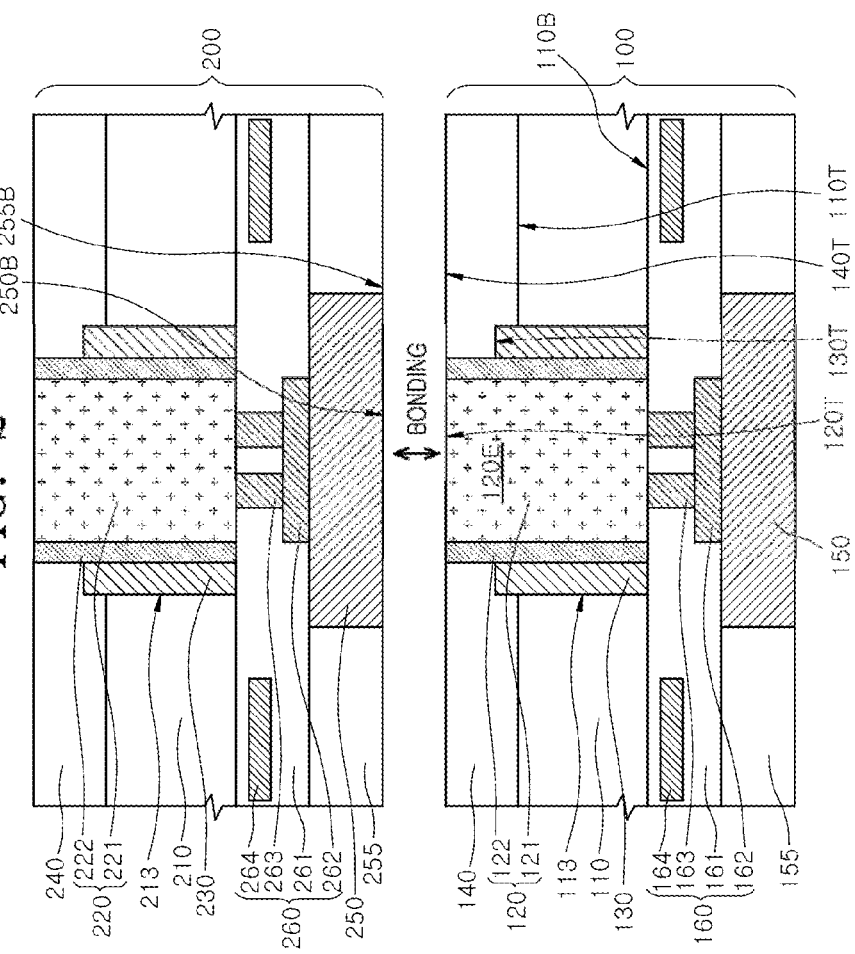
FIG. 2 is a schematic view illustrating direct-bonding of semiconductor substrates of the semiconductor device of FIG. 1.
Figure 3:
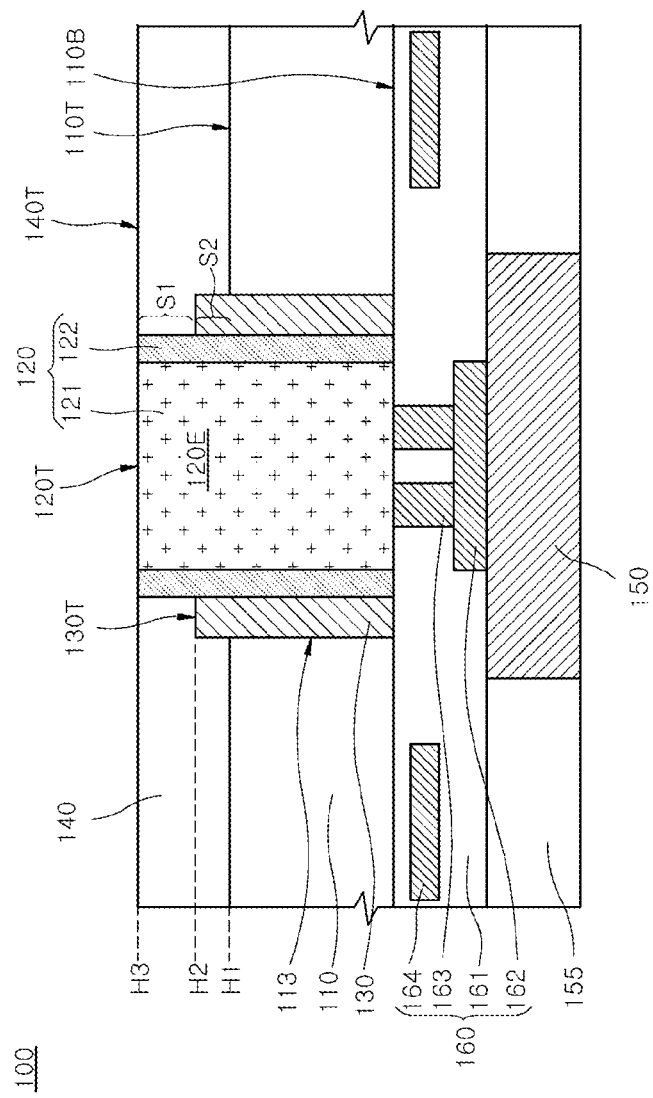
FIG. 3 is a schematic cross-sectional view illustrating a semiconductor substrate of the semiconductor device of FIG. 1.

FIG. 1 is a schematic cross-sectional view illustrating a semiconductor device 10 according to an embodiment of the present disclosure. FIG. 2 is a schematic view illustrating direct-bonding of semiconductor substrates 100 and 200 of the semiconductor device 10 of FIG. 1. FIG. 3 is a schematic cross-sectional view illustrating the first semiconductor substrate 100 of the semiconductor device 10 of FIG. 1.

Referring to FIGS. 1 and 2, the semiconductor device 10 may include the first semiconductor substrate 100 and the second semiconductor substrate 200. The second semiconductor substrate 200 may be substantially vertically stacked on the first semiconductor substrate 100. The first semiconductor substrate 100 may have a shape of a semiconductor wafer. The first semiconductor substrate 100 may have a shape of an individual die that is separated from a semiconductor wafer. The second semiconductor substrate 200 may have the shape of an individual die that is separated from a semiconductor wafer. The second semiconductor substrate 200 may have the shape of a semiconductor wafer. The second semiconductor substrate 200 may have substantially the same shape as the first semiconductor substrate 100 or may include the same elements as the first semiconductor substrate 100. The semiconductor device 10 may have a structure in which semiconductor dies or the semiconductor substrates 100 and 200 are three-dimensionally stacked. The semiconductor device 10 may have a structure in which other semiconductor substrates are placed on a semiconductor substrate at a wafer level.

The second semiconductor substrate 200 may be directly bonded to the first semiconductor substrate 100. A separate bonding member or connection member might not be introduced between the second semiconductor substrate 200 and the first semiconductor substrate 100. For example, connection members, such as solder balls or solder bumps, might not be interposed between the second semiconductor substrate 200 and the first semiconductor substrate 100. The second semiconductor substrate 200 and the first semiconductor substrate 100 may be bonded to each other while facing surfaces that are in contact with and in close contact with each other. A separate adhesive material or underfill material might not be introduced into a bonded interface where the second semiconductor substrate 200 is directly bonded to the first semiconductor substrate 100. This direct bonding of the substrates may indicate hybrid bonding of the substrates.

Referring to FIGS. 1 and 3, the first semiconductor substrate 100 may include a first semiconductor substrate body 110, a first through via 120, a first liner 130, and a first diffusion barrier layer 140. The first semiconductor substrate 100 may further include a first multilevel interconnection structure 160, a first conductive pad 150, and a third diffusion barrier layer 155.

The first semiconductor substrate body 110 may include silicon (Si) or other semiconductor materials. The first semiconductor substrate body 110 may include a first top surface 110T and a first bottom surface 110B that are opposite to each other. Integrated circuit elements (not illustrated) may be integrated on the first bottom surface 110B of the first semiconductor substrate body 110. The integrated circuit elements may include memory devices, such as DRAM devices or NAND devices. The first bottom surface 110B may indicate a front side of the first semiconductor substrate body 110, and the first top surface 110T may indicate a back side of the first semiconductor substrate body 110. The first top surface 110T of the first semiconductor substrate body 110 may be a surface on which integrated circuits are not integrated.

The first through via 120 may be introduced as a vertical connection member that substantially penetrates the first semiconductor substrate body 110 vertically. The first through via 120 may include a conductive material that fills a first opening 113 that substantially penetrates the first semiconductor substrate body 110 vertically. The first opening 113 may be a through hole. The first through via 120 may be introduced as an element, such as a through silicon via (TSV). The first through via 120 may be disposed as a conductive element that extends at least from the first bottom surface 110B to the first top surface 110T of the first semiconductor substrate body 110. The first through via 120 may further extend so that an end portion 120E protrudes from the first top surface 110T of the first semiconductor substrate body 110. The first through via 120 may further extend to penetrate the first diffusion barrier layer 140 substantially vertically.

The first through via 120 may include copper (Cu) with a lower electrical resistance than aluminum (Al) or conductive polycrystalline silicon. The first through via 120 may include a first through via body 121 and a first side barrier layer 122. The first through via body 121 may be formed in a pillar or plug shape including copper (Cu).

The first side barrier layer 122 may be disposed to cover a side surface of the first through via body 121. The first side barrier layer 122 may be introduced as a layer that reduces or substantially blocks the diffusion of copper (Cu) ions in the lateral direction from the first through via body 121. The first side barrier layer 122 may prevent the diffusion of copper (Cu) ions in the lateral direction so that it is possible to reduce or substantially prevent copper (Cu) or copper (Cu) ions constituting the first through via body 121 from being diffused into the first semiconductor substrate body 110 and contaminating the first semiconductor substrate body 110. The first side barrier layer 122 may be formed of a diffusion barrier material that prevents the diffusion of copper (Cu) ions. The first side barrier layer 122 may include a tantalum (Ta) layer or a tantalum nitride (TaN) layer. The first side barrier layer 122 may include a double layer of a tantalum (Ta) layer and a tantalum nitride (TaN) layer. A tantalum (Ta) layer may be disposed between the first through via body 121 and the tantalum nitride layer.

The first liner 130 may be disposed on a side surface of the first side barrier layer 122. The first liner 130 may be disposed to be positioned between the first semiconductor substrate body 110 and the first side barrier layer 122. The first liner 130 may be introduced as an insulation layer that electrically isolates the first side barrier layer 122 and the first semiconductor substrate body 110 or an insulation layer that electrically isolates the first through via 120 and the first semiconductor substrate body 110. The first liner 130 may be introduced as a buffer layer that relieves or reduces the stress that may occur between the first through via 120 and the first semiconductor substrate body 110. The first liner 130 may include a silicon oxide ($SiO_2$) layer. The silicon oxide ($SiO_2$) layer may include silicon oxide, such as tetraethyl orthosilicate (TEOS).

The first liner 130 may further extend between a portion of the first diffusion barrier layer 140 and the first side barrier layer 122. The first liner 130 may further extend to expose a portion of a side surface of the end portion 120E of the first through via 120. The first liner 130 may extend to expose an upper side surface S1 of the end portion 120E of the first through via 120 and to cover a lower side surface S2 of the end portion 120E. The first liner 130 might not extend to completely cover the upper side surface S1 of the end portion 120E of the first through via 120. The lower side surface S2 of the end portion 120E of the first through via 120 may be a side portion that is relatively closer to the first top surface 110T of the first semiconductor substrate body 110 than the upper side surface S1.

The first diffusion barrier layer 140 may be disposed to cover the first top surface 110T of the first semiconductor substrate body 110. The first diffusion barrier layer 140 may be disposed to cover the upper side surface S1 of the end portion 120E of the first through via 120. The end portion 120E of the first through via 120 may further extend to substantially penetrate the first diffusion barrier layer 140 vertically. The first diffusion barrier layer 140 may extend to cover and seal a third top surface 130T of the first liner 130. A second top surface 120T of the end portion 120E of the first through via 120 may be exposed outside a fourth top surface 140T of the first diffusion barrier layer 140. The second top surface 120T of the end portion 120E of the first through via 120 and the fourth top surface 140T of the first diffusion barrier layer 140 may have the same surface level. The second top surface 120T of the end portion 120E of the first through via 120 and the fourth top surface 140T of the first diffusion barrier layer 140 may form a globally planar surface connected to each other without a step difference therebetween.

The first diffusion barrier layer 140 may be disposed as a layer including a dielectric material or an insulating material. The first diffusion barrier layer 140 may include another diffusion barrier material with a lower copper (Cu) ion diffusion rate than the first liner 130. The first diffusion barrier layer 140 may include a diffusion barrier material that is capable of reducing or substantially preventing the diffusion of copper (Cu) ions. The first diffusion barrier layer 140 may include a diffusion barrier material that is capable of reducing or substantially preventing diffusion of copper (Cu) ions, compared to silicon oxide. The first diffusion barrier layer 140 may include a silicon nitride ($Si_3N_4$) layer.

Referring to FIG. 3, the third top surface 130T of the first liner 130 may be positioned at a height H2 that is higher than the height H1 of the first top surface 110T of the first semiconductor substrate body 110. The third top surface 130T of the first liner 130 may have a step difference from the first top surface 110T of the first semiconductor substrate body 110 to form a step shape. The third top surface 130T of the first liner 130 may be positioned at the height H2 that is lower than a height H3 of the second top surface 120T of the end portion 120E of the first through via 120. The heights H1, H2, and H3 may indicate surface heights from the first bottom surface 110B of the first semiconductor substrate body 110. The first diffusion barrier layer 140 may extend to cover the third top surface 130T of the first liner 130. The third top surface 130T of the first liner 130 may be positioned at a height between the first top surface 110T of the first semiconductor substrate body 110 and the second top surface 120T of the end portion 120E of the first through via 120 so that the third top surface 130T of the first liner 130 may be covered by the first diffusion barrier layer 140 to be blocked from the outside while being in close contact with the first diffusion barrier layer 140.

The first semiconductor substrate 100 may further include the first multilevel interconnection structure 160. The first multilevel interconnection structure 160 may be disposed under the first bottom surface 110B of the first semiconductor substrate body 110. The first multilevel interconnection structure 160 may be electrically connected to the first through via 120. The first multilevel interconnection structure 160 may include a plurality of conductive patterns 162, 163, and 164 that are disposed in a first dielectric layer 161. The plurality of conductive patterns 162, 163, and 164 may be insulated from each other due to the first dielectric layer 161. The first conductive pattern 162 and the third conductive pattern 164 may be positioned at different levels. The second conductive pattern 163 may substantially penetrate the first dielectric layer 161 to electrically connect the first conductive pattern 162 to the first through via 120.

The first semiconductor substrate 100 may further include a first conductive pad 150 and a third diffusion barrier layer 155. The first conductive pad 150 may be introduced as a connection member that electrically connects the first semiconductor substrate 100 to an external device or another semiconductor substrate. The first conductive pad 150 may be electrically connected to the first multilevel interconnection structure 160. The first conductive pad 150 may be electrically connected to the integrated circuit elements that are integrated in the first semiconductor substrate 100 through the first multilevel interconnection structure 160. The first conductive pad 150 may be electrically connected to the first through via 120 through the first multilevel interconnection structure 160. The first conductive pad 150 may be electrically connected to the first through via 120 through the first and second conductive patterns 162 and 163.

The first conductive pad 150 may be disposed as a conductive pattern including a metal material, such as copper (Cu). The third diffusion barrier layer 155 may be disposed to cover the first multilevel interconnection structure 160 while exposing a surface of the first conductive pad 150. The third diffusion barrier layer 155 may be disposed as a passivation layer that covers and protects the first multilevel interconnection structure 160. The third diffusion barrier layer 155 may include a silicon nitride ($Si_3N_4$) layer.

Referring to FIGS. 1 and 2, the second semiconductor substrate 200 may be directly bonded to the first semiconductor substrate 100 without interposing another separate layer such as an adhesive layer, a connection member, or a solder layer. Surfaces 250B and 255B of the second semiconductor substrate 200 may be directly coupled to the facing surfaces 120T and 140T of the first semiconductor substrate 100. The first top surface 120T of the first through via 120 of the first semiconductor substrate 100 and the second top surface 140T of the first diffusion barrier layer 140 may provide the surfaces 120T and 140T that are coupled to the second semiconductor substrate 200. The second semiconductor substrate 200 may include a second conductive pad 250 and a second diffusion barrier layer 255. The second conductive pad 250 and the second diffusion barrier layer 255 may provide the surfaces 250B and 255B that are coupled to the first semiconductor substrate 100.

The second conductive pad 250 of the second semiconductor substrate 200 may be directly bonded to the first through via 120 of the first semiconductor substrate 100. The bottom surface 250B of the second conductive pad 250 of the second semiconductor substrate 200 may be directly coupled to the second top surface 120T of the first through via 120 of the first semiconductor substrate 100. The second diffusion barrier layer 255 of the second semiconductor substrate 200 may be directly coupled to the fourth top surface 140T of the first diffusion barrier layer 140 of the first semiconductor substrate 100.

The second conductive pad 250 of the second semiconductor substrate 200 may include substantially the same metal material as the first through via 120 of the first semiconductor substrate 100. The second conductive pad 250 may include copper (Cu). Accordingly, the second conductive pad 250 may be directly bonded to the first through via 120 also formed of copper (Cu). The second diffusion barrier layer 255 of the second semiconductor substrate 200 may include substantially the same dielectric material or insulating material as the first diffusion barrier layer 140 of the first semiconductor substrate 100. The second diffusion barrier layer 255 of the second semiconductor substrate 200 may include silicon nitride ($Si_3N_4$). Accordingly, the second diffusion barrier layer 255 may be directly bonded to the first diffusion barrier layer 140 also formed of silicon nitride ($Si_3N_4$).

Referring to FIG. 2, the second semiconductor substrate 200 may further include a second semiconductor substrate body 210, a second through via 220, a second liner 230, and a fourth diffusion barrier layer 240. The second through via 220 may include a conductive material that fills a second opening 213 that penetrates the second semiconductor substrate body 210.

The second semiconductor substrate 200 may further include a second multilevel interconnection structure 260. The second through via 220 may be electrically connected to the second conductive pad 250 through the second multilevel interconnection structure 260. The second multilevel interconnection structure 260 may include a plurality of conductive patterns 262, 263, and 264 that are disposed in a second dielectric layer 261. The fourth conductive pattern 262 and the sixth conductive pattern 264 may be positioned at different levels. The fifth conductive pattern 263 may electrically connect the fourth conductive pattern 262 to the second through via 220.

Referring to FIGS. 2 and 3, the second semiconductor substrate 200 may include substantially the same elements as the first semiconductor substrate 100. The second semiconductor substrate body 210, the second through via 220, and the second liner 230 of the second semiconductor substrate 200 may indicate the first semiconductor substrate body 110, the first through via 102, and the first liner 130 of the first semiconductor substrate 100. The second semiconductor substrate body 210, the second through via 220, and the second liner 230 of the second semiconductor substrate 200 may be configured to have substantially the same shapes as the first semiconductor substrate body 110, the first through via 120, and the first liner 130 of the first semiconductor substrate 100, respectively.

The fourth diffusion barrier layer 240 of the second semiconductor substrate 200 may indicate the first diffusion barrier layer 140 of the first semiconductor substrate 100. The fourth diffusion barrier layer 240 of the second semiconductor substrate 200 may be configured to have substantially the same shape as the first diffusion barrier layer 140 of the first semiconductor substrate 100. The second multilevel interconnection structure 260 of the second semiconductor substrate 200 may indicate the first multilevel interconnection structure 160 of the first semiconductor substrate 100. The second multilevel interconnection structure 260 of the second semiconductor substrate 200 may be configured to have substantially the same shape as the first multilevel interconnection structure 160 of the first semiconductor substrate 100.

The second conductive pad 250 of the second semiconductor substrate 200 may indicate the first conductive pad 150 of the first semiconductor substrate 100. The second conductive pad 250 of the second semiconductor substrate 200 may be configured to have substantially the same shape as the first conductive pad 150 of the first semiconductor substrate 100. The second diffusion barrier layer 255 of the second semiconductor substrate 200 may indicate the third diffusion barrier layer 155 of the first semiconductor substrate 100. The second diffusion barrier layer 255 of the second semiconductor substrate 200 may be configured to have substantially the same shape as the third diffusion barrier layer 155 of the first semiconductor substrate 100.

Figure 4:
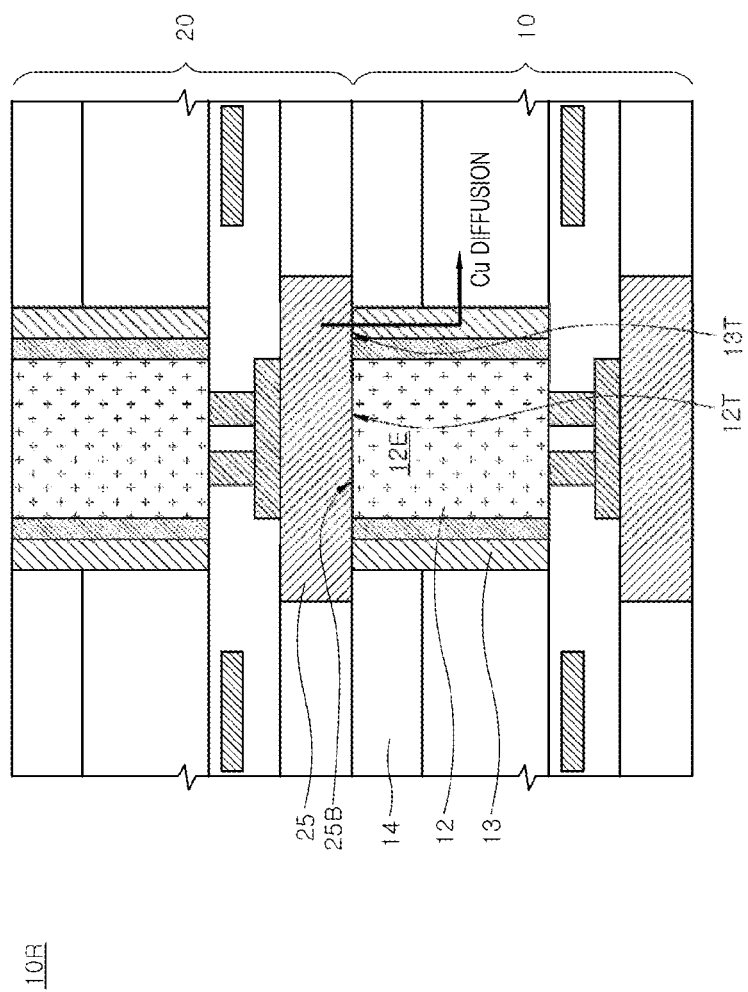
FIG. 4 is a schematic cross-sectional view illustrating copper (Cu) contamination that may occur in bonding of semiconductor substrates according to a comparative example.

FIG. 4 is a schematic cross-sectional view illustrating copper (Cu) contamination that may occur in bonding of semiconductor substrates 10 and 20 according to a comparative example.

Referring to FIG. 4, a semiconductor device 10R according to a comparative example may be configured by directly bonding the second semiconductor substrate 20 to the first semiconductor substrate 10. In a process of configuring the semiconductor device 10R according to the comparative example, copper (Cu) contamination that may occur in the first semiconductor substrate 10 due to copper (Cu) diffusion may be an issue to be overcome. The first semiconductor substrate 10 may include a through via 12, a liner 13, and a diffusion barrier layer 14. The second semiconductor substrate 20 may include a conductive pad 25. When the second semiconductor substrate 20 is directly bonded or directly coupled to the first semiconductor substrate 10, a bottom surface 25B of the conductive pad 25 of the second semiconductor substrate 20 may be coupled to a top surface 12T of the through via 12 of the first semiconductor substrate 10. The liner 13 may extend to substantially cover the entire side surface of an end portion 12E of the through via 12. A top surface 13T of the liner 13 may contact the bottom surface 25B of the conductive pad 25. The liner 13 may be connected to the conductive pad 25 so that the liner 13 may provide a path for copper (Cu) diffusion or copper (Cu) ion diffusion.

As illustrated in FIG. 1, the third top surface 130T of the first liner 130 according to an embodiment of the present disclosure may be covered by a portion of the first diffusion barrier layer 140. Because the third top surface 130T of the first liner 130 is sealed by the portion of the first diffusion barrier layer 140, the third top surface 130T of the first liner 130 may be blocked from contacting the second bottom surface 250B of the second conductive pad 250 of the second semiconductor substrate 200. The portion of the first diffusion barrier layer 140 covering the third top surface 130T of the first liner 130 may serve to isolate the second conductive pad 250 from the first liner 130. Accordingly, the diffusion of copper (Cu) or copper (Cu) ions constituting the second conductive pad 250 into the first liner 130 may be effectively blocked. Because the diffusion of copper (Cu) or copper (Cu) ions may be blocked in this way, the copper (Cu) contamination problem as illustrated in FIG. 4 may be overcome.

Figure 5:
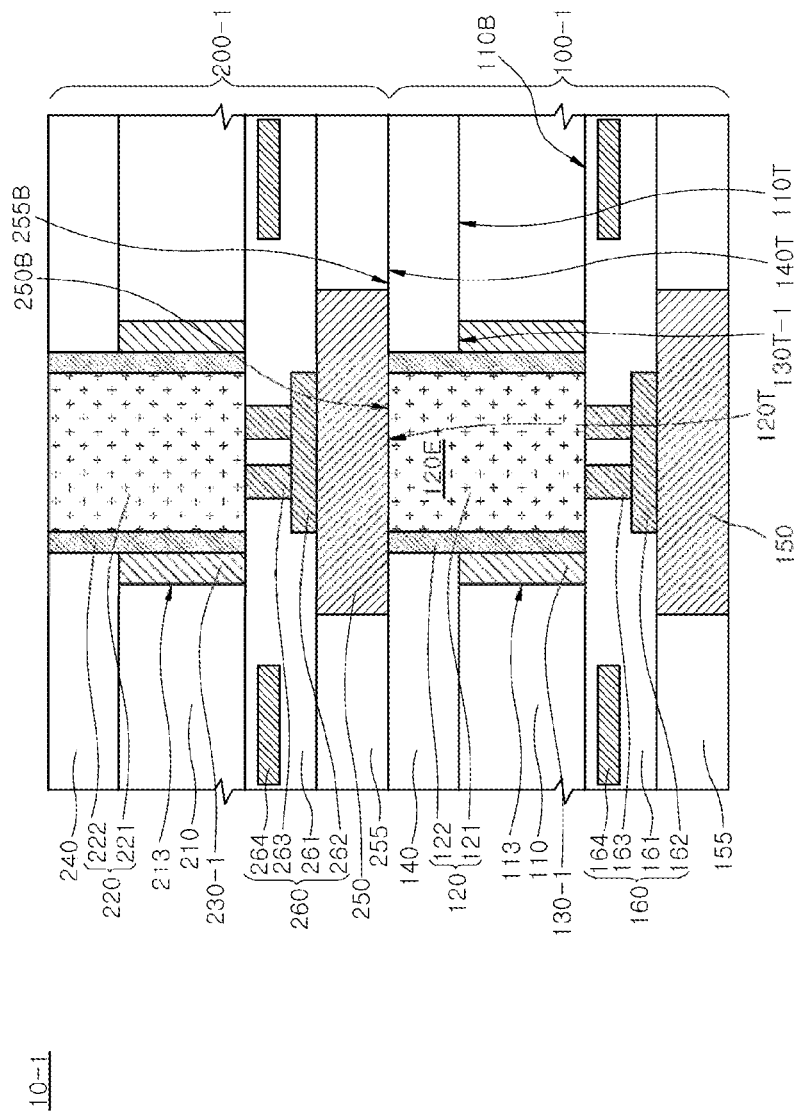
FIG. 5 is a schematic cross-sectional view illustrating a semiconductor device according to another embodiment of the present disclosure.
Figure 6:
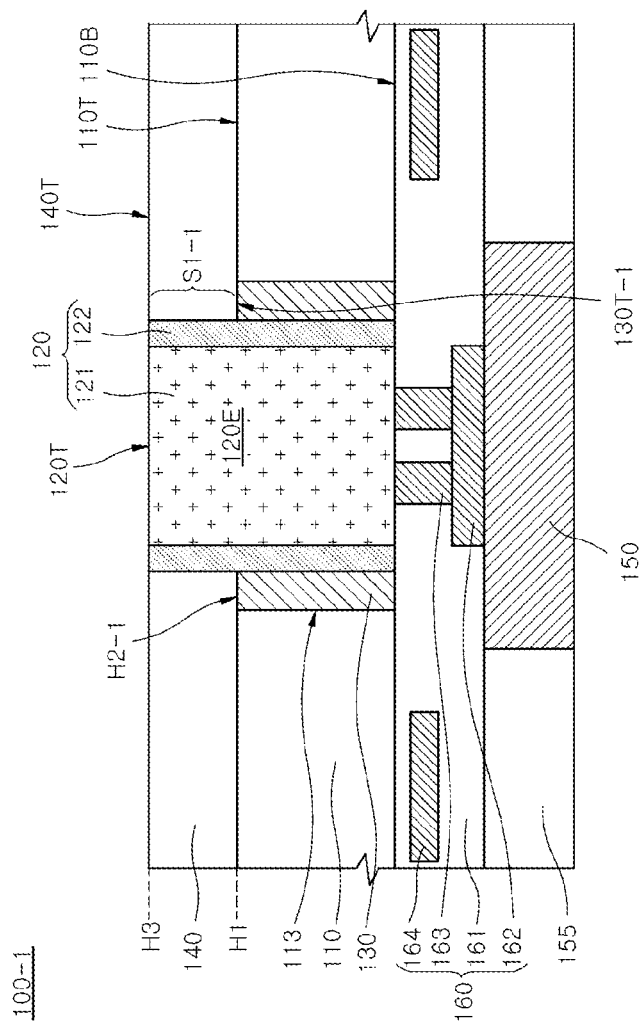
FIG. 6 is a schematic cross-sectional view illustrating a semiconductor substrate of the semiconductor device of FIG. 5.

FIG. 5 is a schematic cross-sectional view illustrating a semiconductor device 10-1 according to another embodiment of the present disclosure. FIG. 6 is a schematic cross-sectional view illustrating a semiconductor substrate 100-1 of the semiconductor device 10-1 of FIG. 5. In FIGS. 5 and 6, the same reference numerals as in FIGS. 1 to 3 may indicate the same elements. In FIGS. 5 and 6, elements presented in substantially the same shapes or similar shapes as those of FIGS. 1 to 3 may indicate the same elements.

Referring to FIGS. 5 and 6, the semiconductor device 10-1 may include the first semiconductor substrate 100-1 and a second semiconductor substrate 200-1. The second semiconductor substrate 200-1 may be directly bonded to the first semiconductor substrate 100-1. The first semiconductor substrate 100-1 may include a first semiconductor substrate body 110, a first through via 120, a first liner 130-1, and a first diffusion barrier layer 140. The first semiconductor substrate 100-1 may further include a first multilevel interconnection structure 160, a first conductive pad 150, and a third diffusion barrier layer 155. The second semiconductor substrate 200-1 may include at least a second liner 230-1, a second conductive pad 250, and a second diffusion barrier layer 255. The second semiconductor substrate 200-1 may include substantially the same elements as the first semiconductor substrate 100-1.

The first liner 130-1 of the first semiconductor substrate 100-1 may expose a side surface S1-1 of an end portion 120E of the first through via 120 and may extend between the first semiconductor substrate body 110 and a first side barrier layer 122. The height H2-1 of a third top surface 130T of the first liner 130-1 may be substantially equal to the height H1 of a first top surface 110T of the first semiconductor substrate body 110. The third top surface 130T-1 of the first liner 130-1 may be positioned at the height H2-1 that is lower than the second top surface 120T of the first through via 120 so that a portion of the first diffusion barrier layer 140 may cover and shield the third top surface 130T-1 of the first liner 130-1. Accordingly, the first liner 130-1 may be isolated from a second bottom surface 250B of the second conductive pad 250 of the second semiconductor substrate 200-1 due to the first diffusion barrier layer 140. Accordingly, it is possible to effectively block the diffusion of copper (Cu) ions or copper (Cu) components constituting the second conductive pad 250 into the first semiconductor substrate 100-1 through the first liner 130-1.

Figure 7:
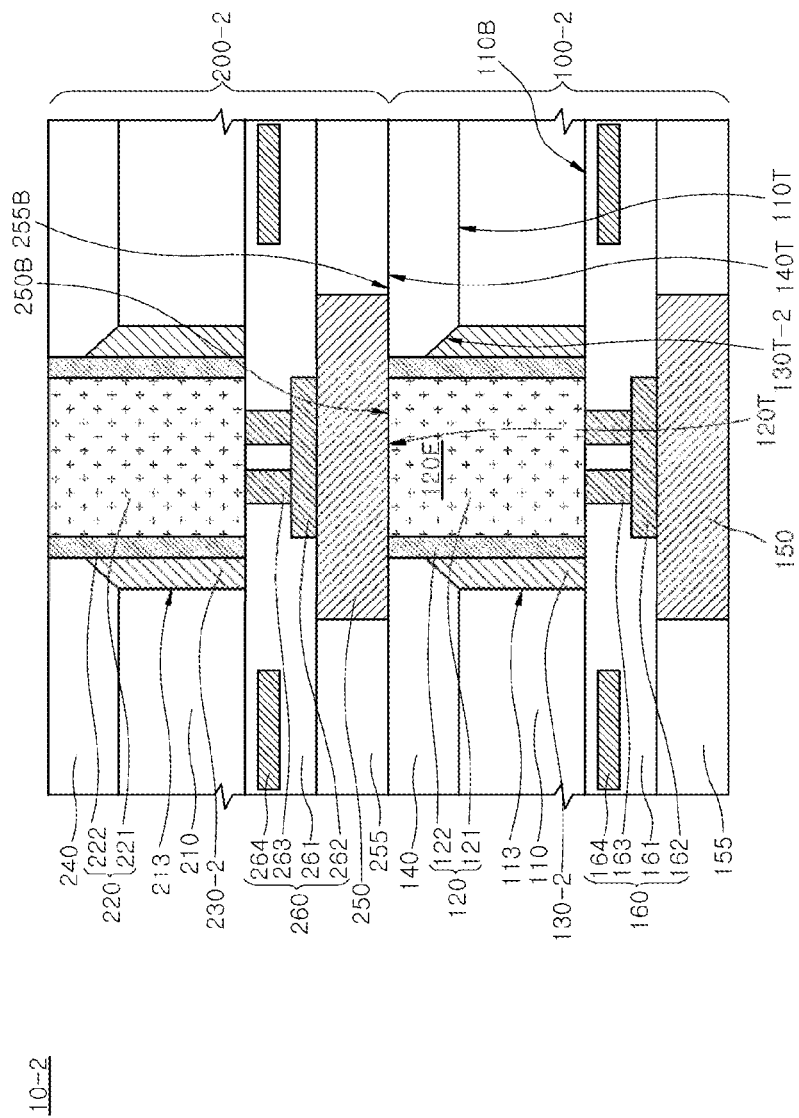
FIG. 7 is a schematic cross-sectional view illustrating a semiconductor device according to another embodiment of the present disclosure.
Figure 8:
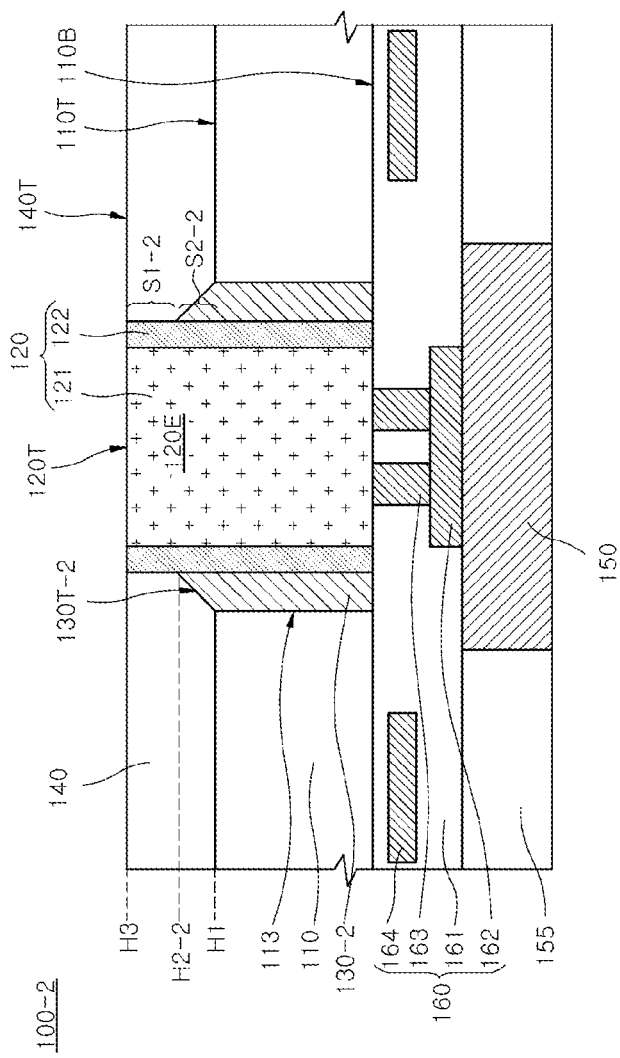
FIG. 8 is a schematic cross-sectional view illustrating a semiconductor substrate of the semiconductor device of FIG. 7.

FIG. 7 is a schematic cross-sectional view illustrating a semiconductor device 10-2 according to another embodiment of the present disclosure. FIG. 8 is a schematic cross-sectional view illustrating a semiconductor substrate 100-2 of the semiconductor device 10-2 of FIG. 7. In FIGS. 7 and 8, the same reference numerals as in FIGS. 1 to 3 may indicate the same elements. In FIGS. 7 and 8, elements presented in substantially the same shapes or similar shapes as those of FIGS. 1 to 3 may indicate the same elements.

Referring to FIGS. 7 and 8, the semiconductor device 10-2 may include a first semiconductor substrate 100-2 and a second semiconductor substrate 200-2. The second semiconductor substrate 200-2 may be directly bonded to the first semiconductor substrate 100-2. The first semiconductor substrate 100-2 may include a first semiconductor substrate body 110, a first through via 120, a first liner 130-2, and a first diffusion barrier layer 140. The first semiconductor substrate 100-2 may further include a first multilevel interconnection structure 160, a first conductive pad 150, and a third diffusion barrier layer 155. The second semiconductor substrate 200-2 may include at least a second liner 230-2, a second conductive pad 250, and a second diffusion barrier layer 255. The second semiconductor substrate 200-2 may include substantially the same elements as the first semiconductor substrate 100-2.

The first liner 130-2 may expose an upper side S1-2 of an end portion 120E of the first through via 120 and extend to cover a lower side S2-2 of the end portion 120E. The first liner 130-2 may expose the upper side S1-2 of the end portion 120E of the first through via 120 and extend between the first semiconductor substrate body 110 and a first side barrier layer 122. A third top surface 130T-2 of the first liner 130-2 may have a shape of an inclined surface. A height H2-2 of the third top surface 130T-2 may be higher than a height H1 of a first top surface 110T of the first semiconductor substrate body 110. The third top surface 130T-2 of the first liner 130-2 may be an inclined surface, one end of which extends from the first top surface 110T of the first semiconductor substrate body 110 and the other opposite end of which is positioned at the height H2-2 higher than the first top surface 110T of the first semiconductor substrate body 110.

The third top surface 130T-2 of the first liner 130-2 is positioned at the height H2-2 that is lower than a second top surface 120T of the first though via 120 so that a portion of the first diffusion barrier layer 140 may cover and shield the third top surface 130T-2 of the first liner 130-2. Accordingly, the first liner 130-2 may be isolated from a second bottom surface 250B of the second conductive pad 250 of the second semiconductor substrate 200-2 due to the first diffusion barrier layer 140. It is possible to effectively block copper (Cu) ions or copper (Cu) components constituting the second conductive pad 250 from being diffused into the first semiconductor substrate 110-2 through the first liner 130-2.

Figure 9:
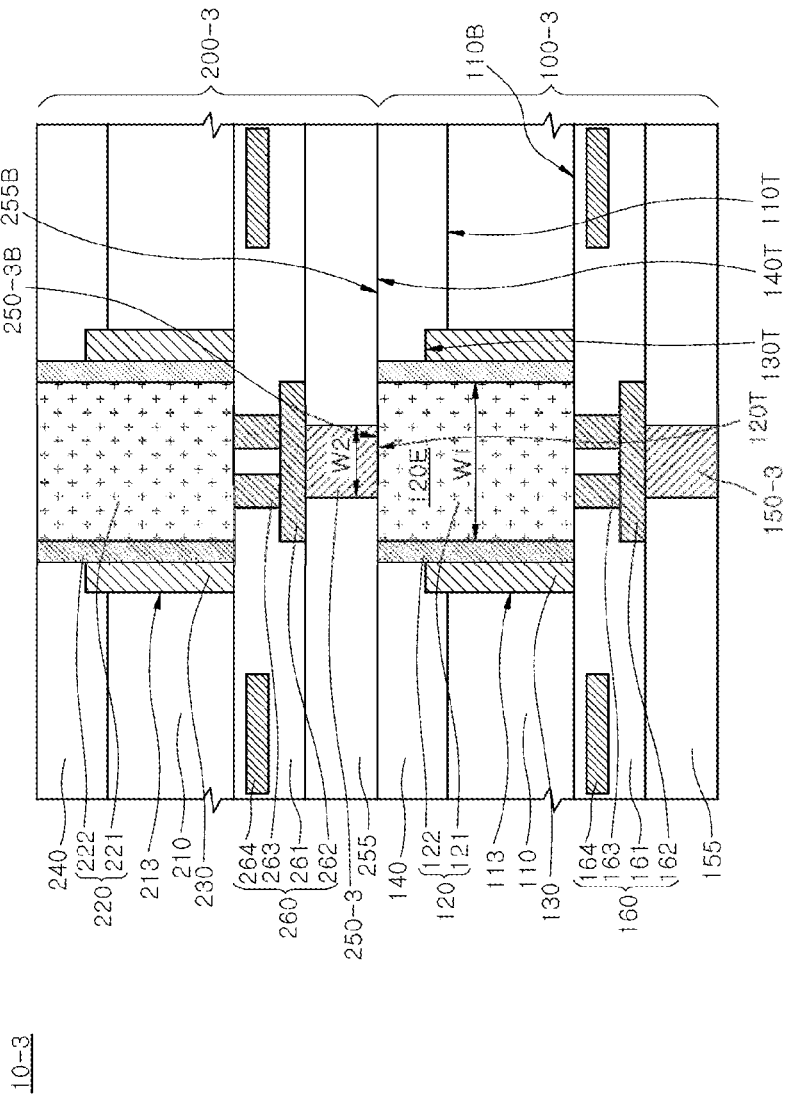
FIG. 9 is a schematic cross-sectional view illustrating a semiconductor device according to another embodiment of the present disclosure.

FIG. 9 is a schematic cross-sectional view illustrating a semiconductor device 10-3 according to another embodiment of the present disclosure. In FIG. 9, the same reference numerals as those of FIGS. 1 to 3 may indicate the same elements. In FIG. 9, elements presented in substantially the same shapes or shapes similar to those of FIGS. 1 to 3 may indicate the same elements.

Referring to FIG. 9, the semiconductor device 10-3 may include a first semiconductor substrate 100-3 and a second semiconductor substrate 200-3. The second semiconductor substrate 200-3 may be directly bonded to the first semiconductor substrate 100-3. The first semiconductor substrate 100-3 may include a first semiconductor substrate body 110, a first through via 120, a first liner 130, and a first diffusion barrier layer 140. The first semiconductor substrate 100-3 may further include a first multilevel interconnection structure 160, a first conductive pad 150-3, and a third diffusion barrier layer 155. The second semiconductor substrate 200-3 may include at least a second conductive pad 250-3 and a second diffusion barrier layer 255. The second semiconductor substrate 200-3 may include substantially the same elements as the first semiconductor substrate 100-3.

The second conductive pad 250-3 of the second semiconductor substrate 200-3 may have a width W2 that is narrower than a width W1 of the first through via 120 of the first semiconductor substrate 100-3. The width W1 may indicate a diameter of the first through via 120, and the width W2 may indicate a diameter of the second conductive pad 250-3. The second conductive pad 250-3 may have the width W2 of ½ to ⅙ times the width W1 of the first through via 120. The second conductive pad 250-3 may have a diameter or width W2 of approximately 1.0 μm to 2.0 μm, while the first through via 120 may have a diameter or width W1 of 4.0 μm to 6.0 μm. Accordingly, the surface area of a second bottom surface 250-3B of the second conductive pad 250-3 may be smaller than the surface area of a second top surface 120T of the first through via 120.

Because the second conductive pad 250-3 has the width W2 narrower than the width W1 of the first through via 120, when the second semiconductor substrate 200-3 is directly bonded to the first semiconductor substrate 100-3, the possibility that the second conductive pad 250-3 is positioned within the range of the second top surface 120T of the first through via 120 may be improved or increased. When the second semiconductor substrate 200-3 is directly bonded to the first semiconductor substrate 100-3, the second semiconductor substrate 200-3 may be aligned with the first semiconductor substrate 100-3, and the second conductive pad 250-3 may be aligned with the first through via 120. Because the width W2 of the second conductive pad 250-3 is narrower than the width W1 of the first through via 120, the possibility of the second conductive pad 250-3 to be aligned within the range of the second top surface 120T of the first through via 120 or alignment margin may be improved.

Referring to FIG. 1 again, the second conductive pad 250 of the second semiconductor substrate 200 may have a wider width than the first through via 120. When the second conductive pad 250 is coupled to the first through via 120, a portion of the second conductive pad 250 may be out of the range of the second top surface 120T of the first through via 120, thereby overlapping with a portion of the first diffusion barrier layer 140 of the first semiconductor substrate 100 below. In contrast, the second conductive pad 250-3, illustrated in FIG. 9, may be positioned within the range of the second top surface 120T of the first through via 120, and a portion of the second top surface 120T of the first through via 120 may be covered by the second diffusion barrier layer 255 of the second semiconductor substrate 200-3. Accordingly, the portion between the second conductive pad 250-3 of the second semiconductor substrate 200-3 and the first liner 130 of the first semiconductor substrate 100-3 may be additionally blocked by the overlapping portion of the second diffusion barrier layer 255. The portion between the second conductive pad 250-3 and the first liner 130 may be at least double blocked by the overlapping portion of the second diffusion barrier layer 255 and a portion of the first diffusion barrier layer 140. Accordingly, the diffusion of copper (Cu) components constituting the second conductive pad 250-3 into the first liner 130 may be more effectively blocked.

Figure 10:
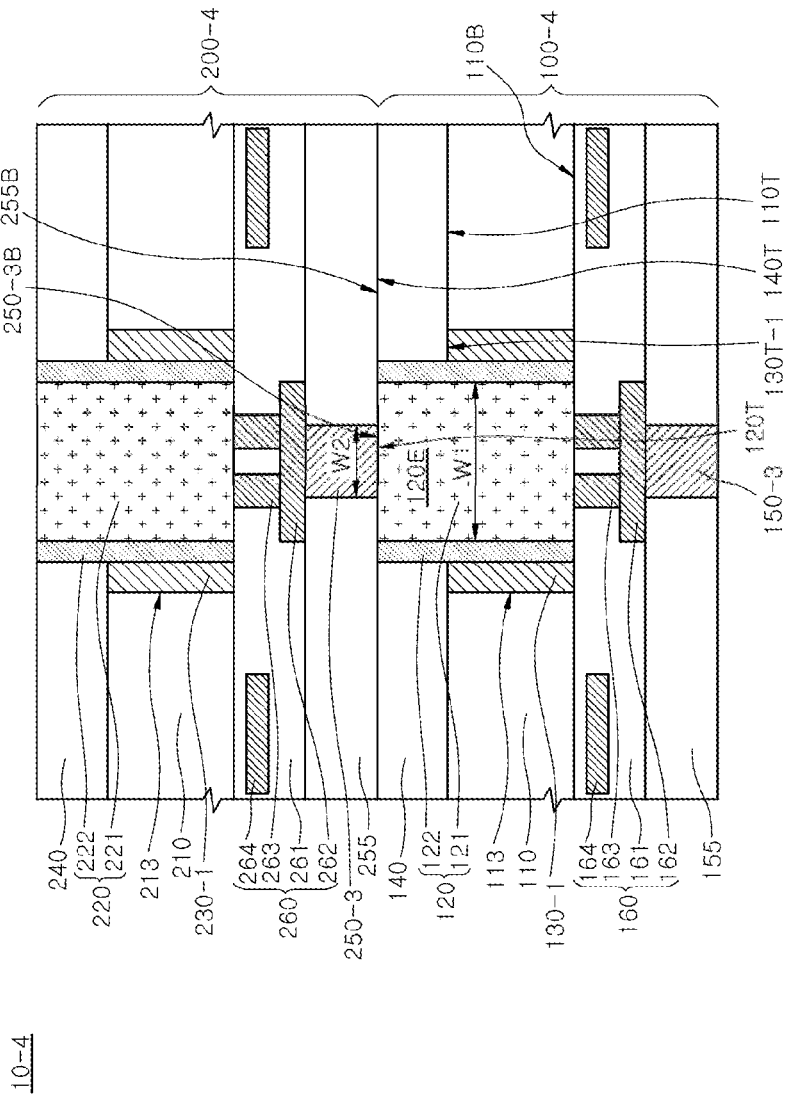
FIG. 10 is a schematic cross-sectional view illustrating a semiconductor device according to another embodiment of the present disclosure.

FIG. 10 is a schematic cross-sectional view illustrating a semiconductor device 10-4 according to another embodiment of the present disclosure. In FIG. 10, the same reference numerals as in FIGS. 5, 6 and 9 may indicate the same elements. In FIG. 10, elements presented in substantially the same shapes or similar shapes as those of FIGS. 5, 6 and 9 may indicate the same elements.

Referring to FIG. 10, the semiconductor device 10-4 may include a first semiconductor substrate 100-4 and a second semiconductor substrate 200-4. The second semiconductor substrate 200-4 may be directly bonded to the first semiconductor substrate 100-4. The first semiconductor substrate 100-4 may include a first semiconductor substrate body 110, a first through via 120, a first liner 130-1, and a first diffusion barrier layer 140. The first semiconductor substrate 100-4 may further include a first multilevel interconnection structure 160, a first conductive pad 150-3, and a third diffusion barrier layer 155. The second semiconductor substrate 200-4 may include at least a second conductive pad 250-3 and a second diffusion barrier layer 255. The second semiconductor substrate 200-4 may include substantially the same elements as the first semiconductor substrate 100-4.

The second conductive pad 250-3 of the second semiconductor substrate 200-4 may have a width W2 that is smaller than a width W1 of the first through via 120 of the first semiconductor substrate 100-4. Accordingly, the diffusion of copper (Cu) components constituting the second conductive pad 250-3 into the first liner 130-1 may be more effectively blocked.

Figure 11:
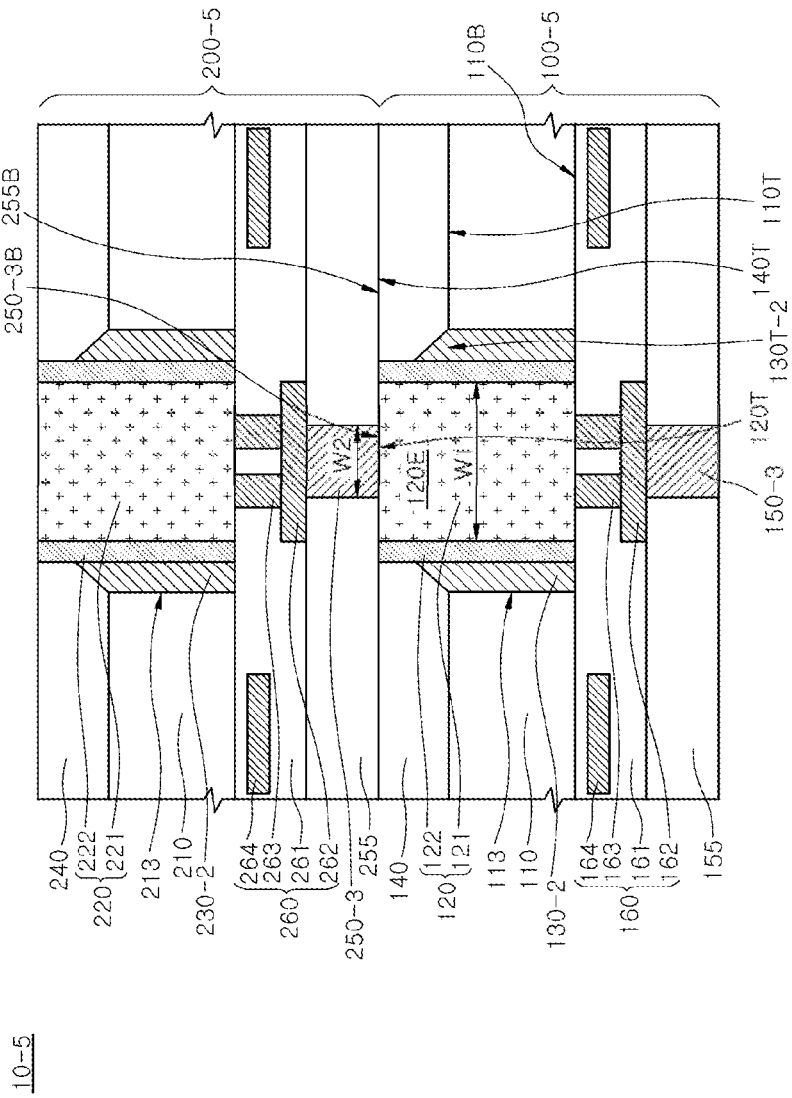
FIG. 11 is a schematic cross-sectional view illustrating a semiconductor device according to another embodiment of the present disclosure.

FIG. 11 is a schematic cross-sectional view illustrating a semiconductor device 10-5 according to another embodiment of the present disclosure. In FIG. 11, the same reference numerals as in FIGS. 7 to 9 may indicate the same elements. In FIG. 11, elements presented in substantially the same shapes or similar shapes as those of FIGS. 7 to 9 may indicate the same elements.

Referring to FIG. 11, the semiconductor device 10-5 may include a first semiconductor substrate 100-5 and a second semiconductor substrate 200-5. The second semiconductor substrate 200-5 may be directly bonded to the first semiconductor substrate 100-5. The first semiconductor substrate 100-5 may include a first semiconductor substrate body 110, a first through via 120, a first liner 130-2, and a first diffusion barrier layer 140. The first semiconductor substrate 100-5 may further include a first multilevel interconnection structure 160, a first conductive pad 150-3, and a third diffusion barrier layer 155. The second semiconductor substrate 200-5 may include at least a second conductive pad 250-3 and a second diffusion barrier layer 255. The second semiconductor substrate 200-5 may include substantially the same elements as the first semiconductor substrate 100-5.

The second conductive pad 250-3 of the second semiconductor substrate 200-5 may have a width W2 smaller than a width W1 of the first through via 120 of the first semiconductor substrate 100-5. Accordingly, the diffusion of copper (Cu) component constituting the second conductive pad 250-3 into the first liner 130-2 may be more effectively blocked.

FIGS. 12 to 17 are schematic cross-sectional views illustrating a method of fabricating a semiconductor device according to an embodiment of the present disclosure. FIGS. 12 to 17 may schematically illustrate process steps of forming the first semiconductor substrate 100 of FIG. 3. In FIGS. 12 to 17, the same reference numerals as in FIG. 3 may indicate the same elements. In FIGS. 12 to 17, elements presented in substantially the same shapes or shapes similar to those of FIG. 3 may indicate the same elements.

Figure 12:
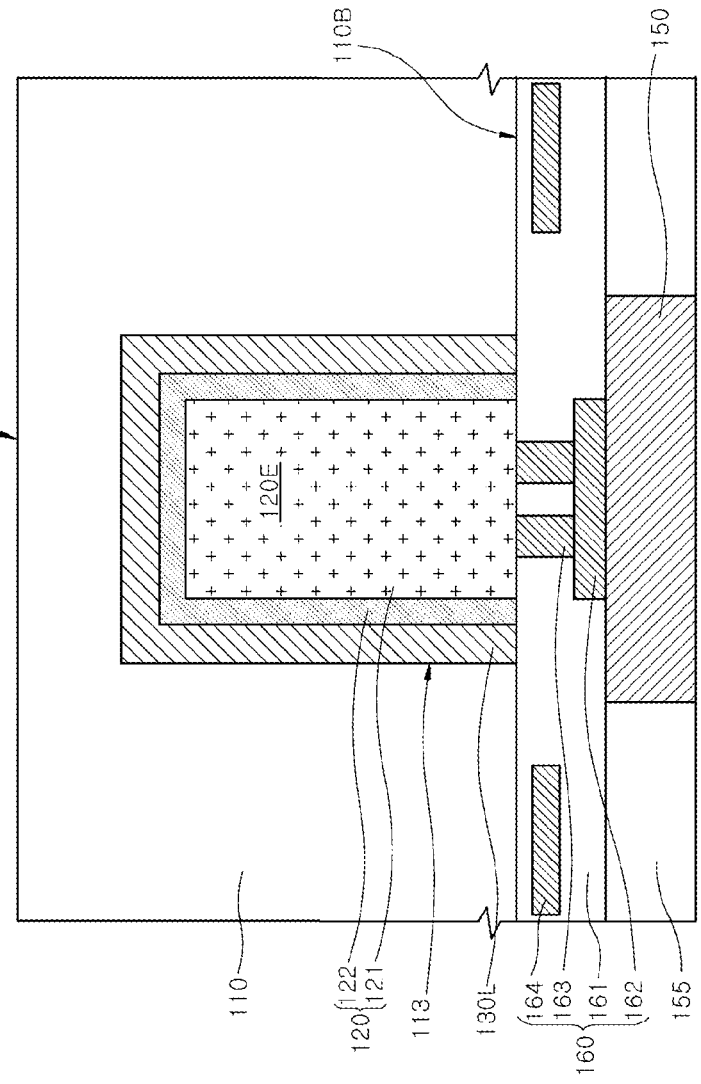
FIGS. 12 to 17 are schematic cross-sectional views illustrating a method of fabricating a semiconductor device according to an embodiment of the present disclosure.

Referring to FIG. 12, a first through via 120 that is surrounded by a first liner 130L may be formed in a first semiconductor substrate body 110. The first semiconductor substrate body 110 may include a semiconductor substrate with a first bottom surface 110B and an initial first top surface 110T-S that are opposite to each other. A first opening 113 may be formed at the first bottom surface 110B of the first semiconductor substrate body 110. Detailed process steps of integrating integrated circuit elements (not shown) on the first bottom surface 110B of the first semiconductor substrate body 110 may precede the process of forming the first opening 113.

The first liner 130L may be formed in the first opening 113 formed in the first semiconductor substrate body 110. The first liner 130L may be formed as a layer that extends to conformally cover the sidewall and bottom of the first opening 113. A first side barrier layer 122 may be formed to cover the first liner 130L. A first through via body 121 may be formed to cover the first side barrier layer 122 and may substantially fill and bury the first opening 113. The first through via 120 may be surrounded by the first liner 130L.

A first multilevel interconnection structure 160 may further be formed under the first bottom surface 110B of the first semiconductor substrate body 110. A first conductive pad 150 and a third diffusion barrier layer 155 may further be formed under the first multilevel interconnection structure 160.

Figure 13:
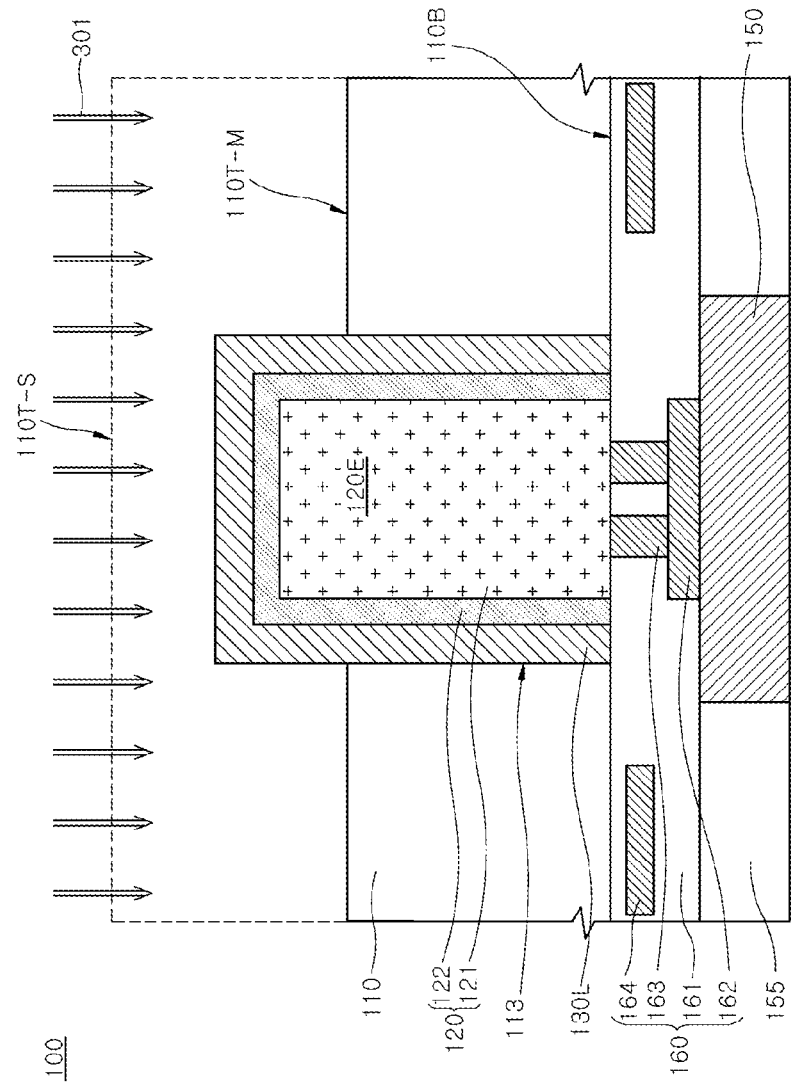

Referring to FIG. 13, the first semiconductor substrate body 110 may be first recessed (301) from the initial top surface 110T-S. A first recessed first top surface 110T-M of the first semiconductor substrate body 110 may be formed by the first recessing. The first recessed first top surface 110T-M of the first semiconductor substrate body 110 may be an intermediate first top surface 110T-M before the first top surface 110T of FIG. 3 is formed and may be exposed by the first recessing. The first semiconductor substrate body 110 may be first recessed (301) by a dry etching process. The dry etching process may be performed as a process of selectively removing silicon (Si) constituting the first semiconductor substrate body 110.

By the first recessing (301), a portion of the first semiconductor substrate body 110 may be removed so that an end portion 120E of the first through via 120 protrudes from the first recessed first top surface 110T-M of the first semiconductor substrate body 110. The end portion 120E of the first through via 120 may protrude from the first recessed first top surface 110T-M of the first semiconductor substrate body 110 while being covered by the first liner 130L.

Figure 14:
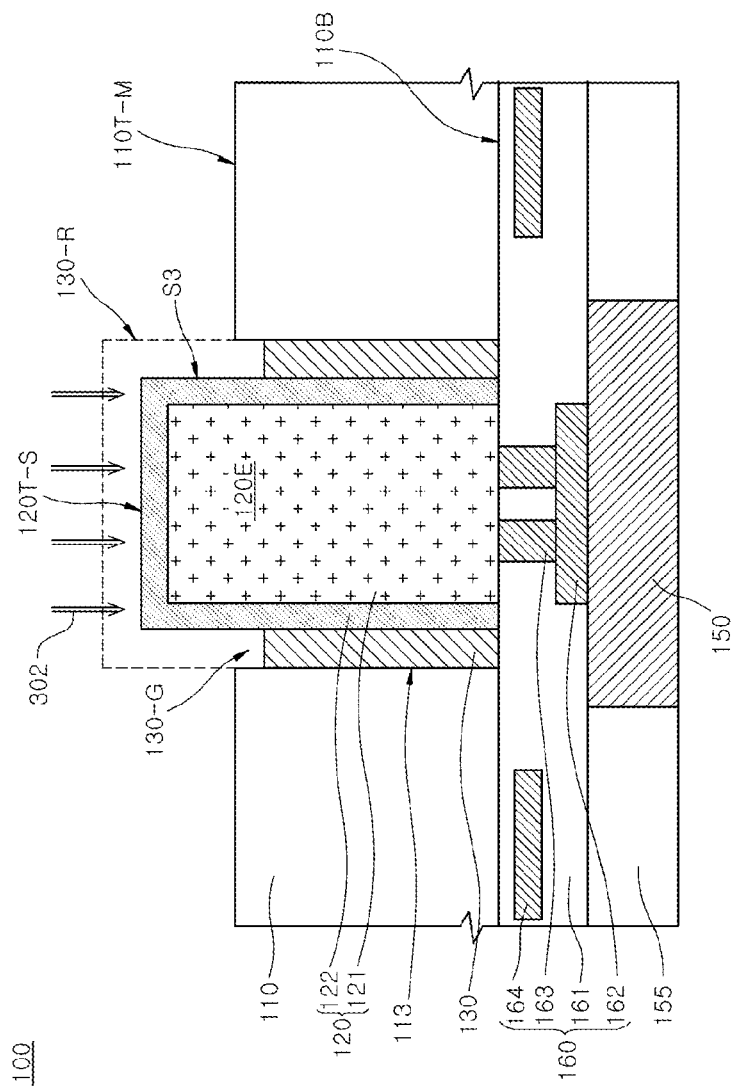

Referring to FIG. 14, a portion 130-R of the first liner (130L of FIG. 13) that surrounds the end portion 120E of the first through via 120 may be removed (302). As the portion 130-R of the first liner 130L that surrounds the end portion 120E of the first through via 120 is removed, the first liner 130 may be confined between the first semiconductor substrate body 110 and the first through via 120. Accordingly, a portion S3 of the side surface and the second top surface 120T-S of the first through via 120 may be exposed to the outside of the first liner 130. The first side barrier layer 122 may extend to cover the second top surface 120T-S of the first through via 120.

The process of removing the portion 130-R of the first liner 130 that surrounds the end portion 120E of the first through via 120 may include a wet etching process. The wet etching process may be performed as a process of selectively removing silicon oxide constituting the first liner 130. While the portion 130-R of the first liner 130 that surrounds the end portion 120E of the first through via 120 is removed by wet etching, a concave dent 130-G may occur between the first semiconductor substrate body 110 and the side surface of the end portion 120E of the first through via 120. In the process of completely removing the portion 130-R of the first liner 130 that surrounds the end portion 120E of the first through via 120 by wet etching, the first liner 130 may be over-etched. Accordingly, the concave dent 130-G may be generated.

Figure 15:
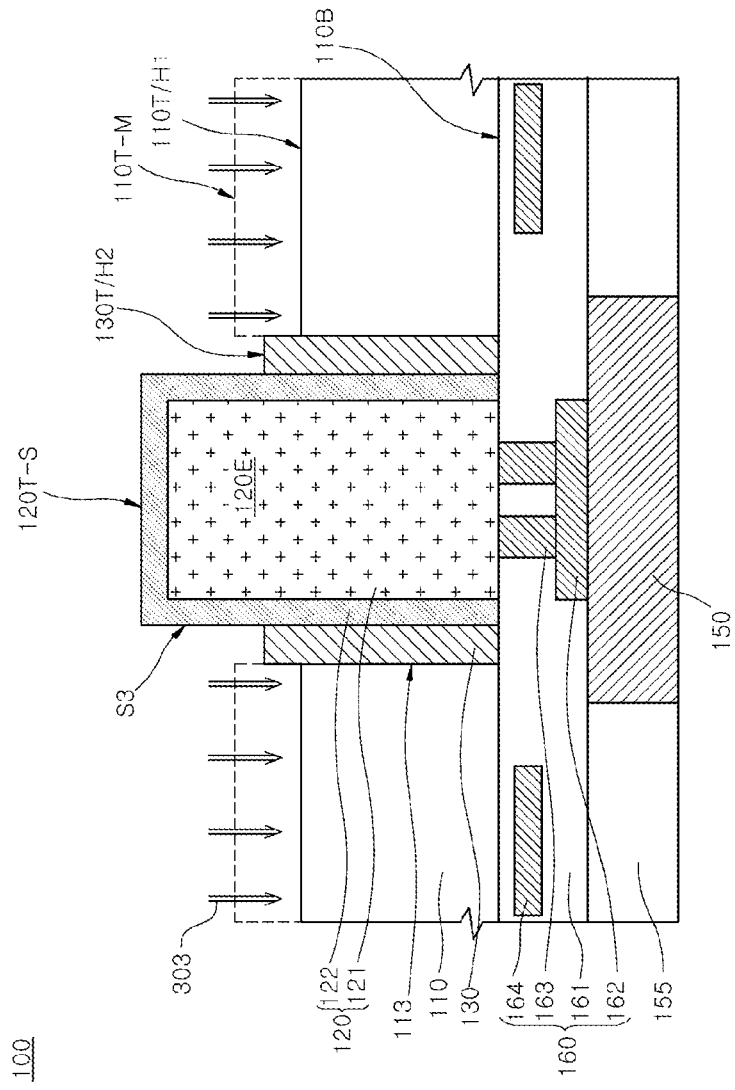

Referring to FIG. 15, the first semiconductor substrate body 110 may be second recessed (303). By second recessing (303) the first recessed first top surface 110T-M of the first semiconductor substrate body 110, the height of the first recessed first top surface 110T-M may be lowered to a level of the second recessed first top surface 110T. The second recessing (303) may be performed so that the second recessed first top surface 110T has a height H1 that is lower than the height H2 of a third top surface 130T of the first liner 130. Accordingly, the third top surface 130T of the first liner 130 may be positioned at the height H2 that is lower than the second top surface 120T-S of the end portion 120E of the first through via 120 and higher than the second recessed first top surface 110T. By performing the second recessing (303) in such a way, the concave shape of the dent 130-G of FIG. 14 may be removed.

Figure 16:
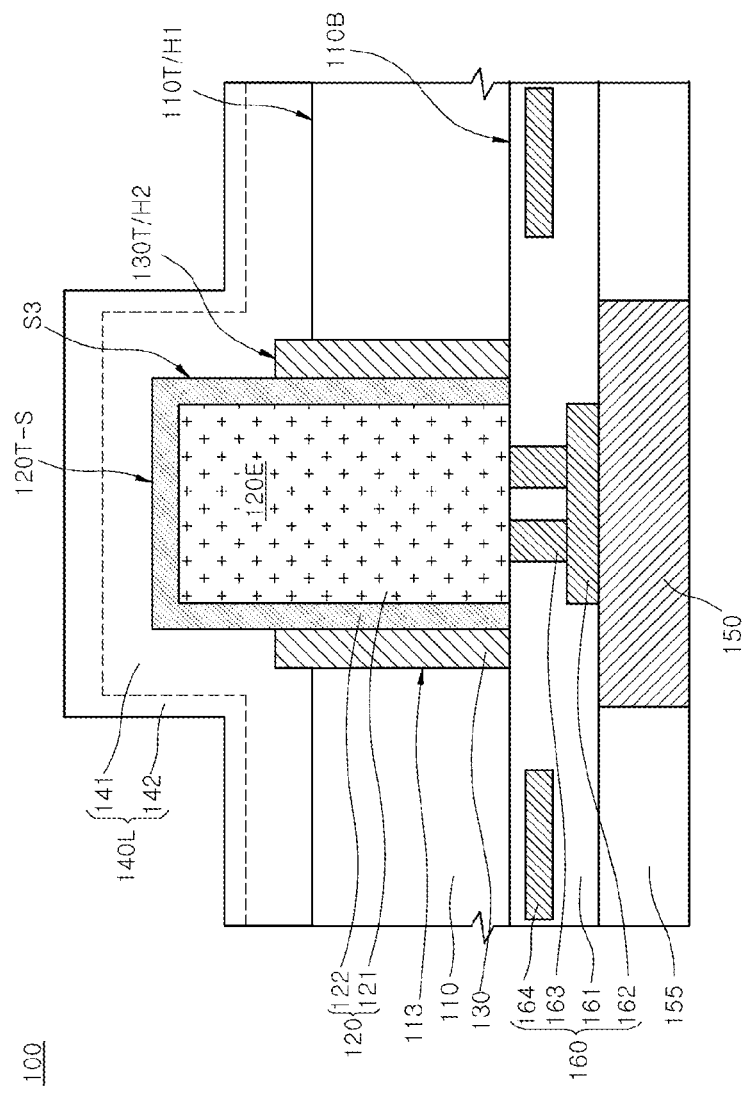

Referring to FIG. 16, a first diffusion barrier layer 140L may be formed. The first diffusion barrier layer 140L may extend to cover the second recessed first top surface 110T of the first semiconductor substrate body 110 and cover the second top surface 120T-S and a portion S3 of the side surface of the end portion 120E of the first through via 120. The first diffusion barrier layer 140L may be formed through a deposition process. The first diffusion barrier layer 140L may include a plurality of sub-layers. The first diffusion barrier layer 140L may be formed by depositing a first sub-layer 141 and depositing a second sub-layer 142 on the first sub-layer 141. The first sub-layer 141 may include a different dielectric material from the second sub-layer 142. The first sub-layer 141 may include a silicon nitride layer, and the second sub-layer 142 may include a silicon oxide layer. The silicon oxide layer may serve as a stress buffer that compensates for the relative vulnerability of the silicon nitride layer to stress. The silicon oxide layer of the second sub-layer 142 may be formed on the silicon nitride layer. Accordingly, the first liner 130 and the first through via 120 might not contact the silicon oxide layer due to the silicon nitride layer.

Figure 17:
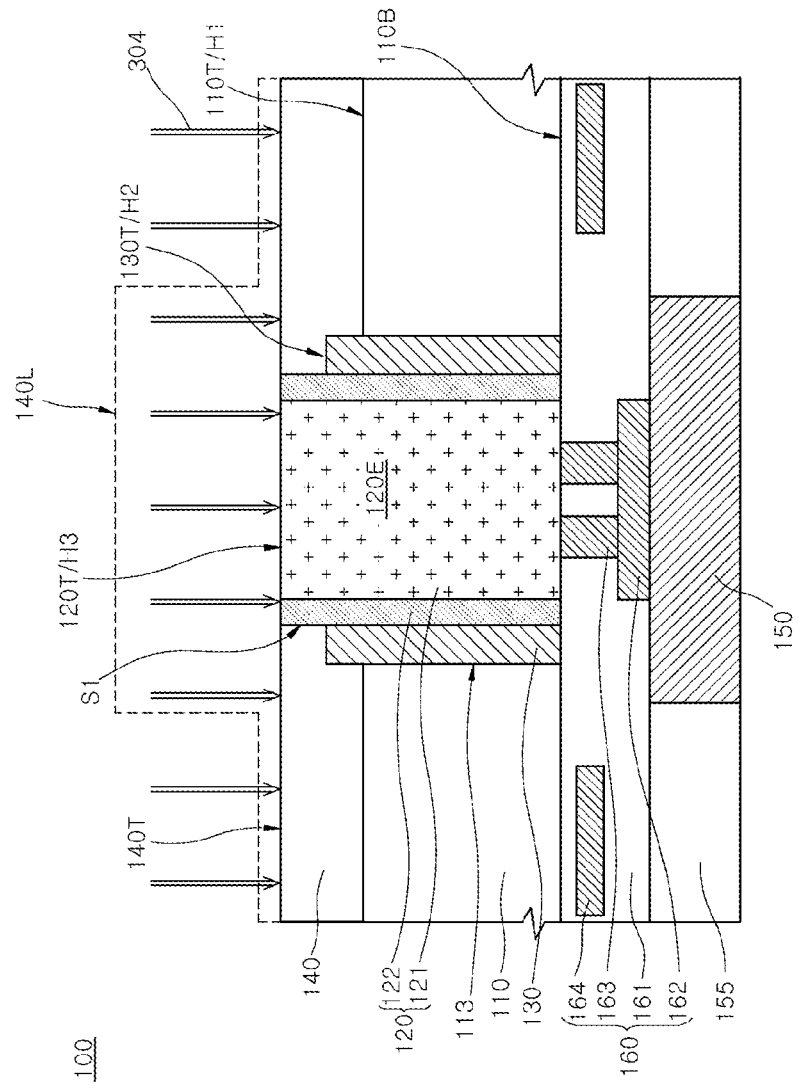

Referring to FIG. 17, the first diffusion barrier layer 140L may be planarized (304). A chemical mechanical polishing (CMP) process may be performed to the first diffusion barrier layer 140L to form a planarized first diffusion barrier layer 140. The first diffusion barrier layer 140L may be chemically mechanically polished to expose the second top surface 120T of the end portion 120E of the first through via 120. While the first diffusion barrier layer 140L is chemically mechanically polished, a portion of the end portion 120E of the first through via 120 may be removed together. Accordingly, a top surface of the first through via body 122 may be exposed to the second top surface 120T of the end portion 120E of the first through via 120.

The second semiconductor substrate (200 of FIG. 1) may be directly bonded to the first semiconductor substrate 100 that is formed as described above, thereby forming the semiconductor device (10 of FIG. 1).

Figure 18:
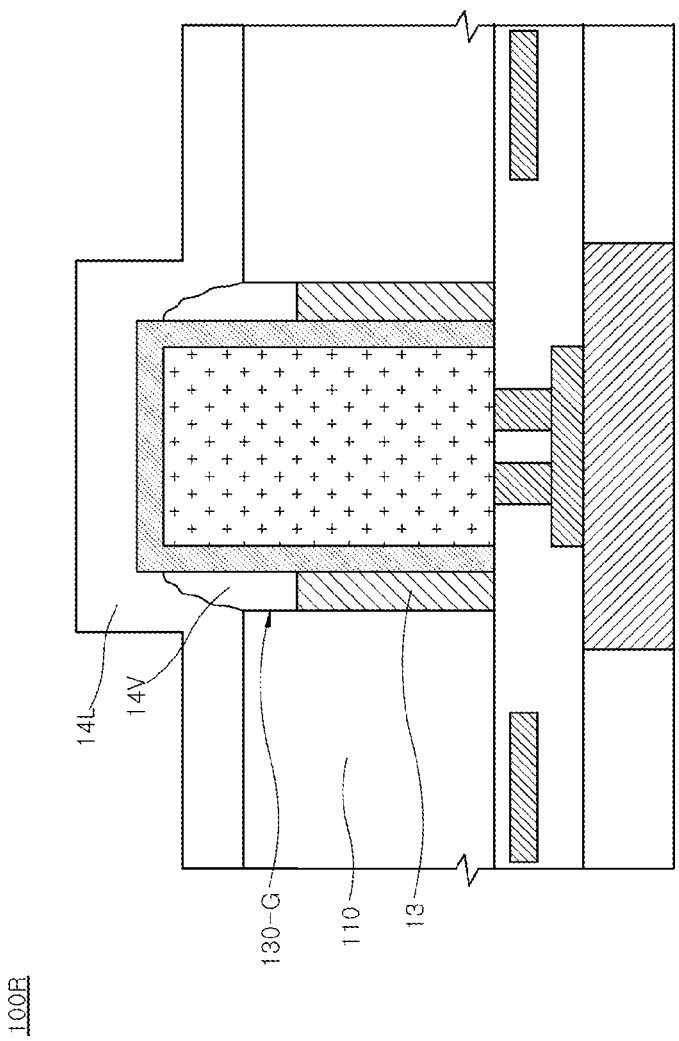
FIG. 18 is a schematic cross-sectional view illustrating that voids are generated in a semiconductor substrate according to a comparative example.
Figure 19:
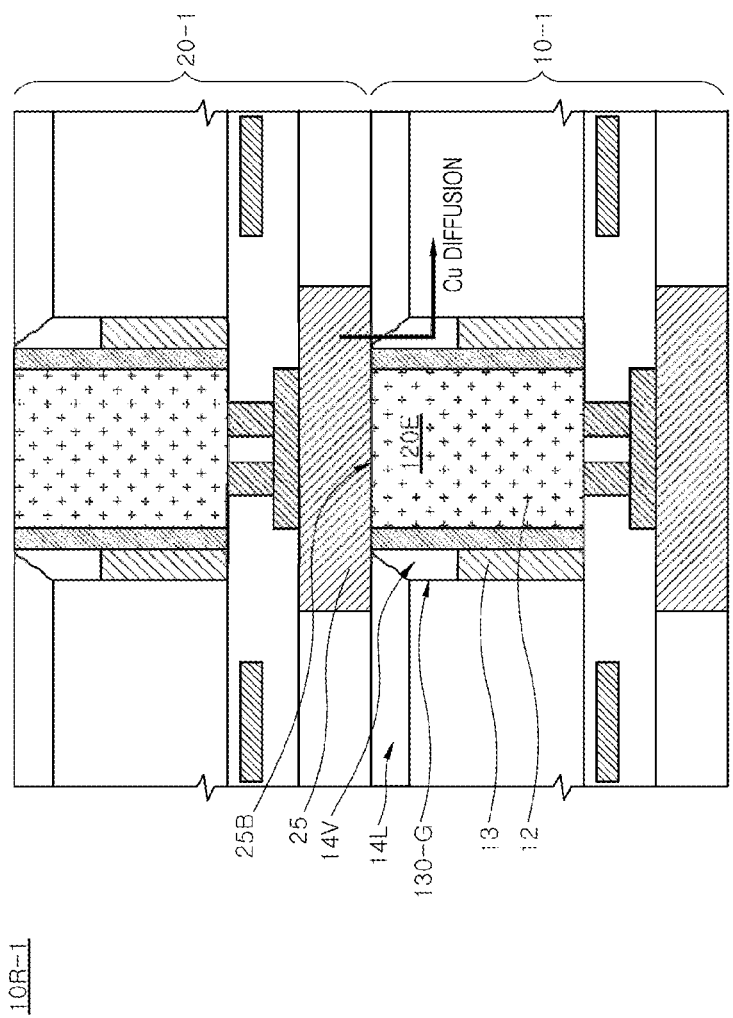
FIG. 19 is a schematic cross-sectional view illustrating copper (Cu) contamination that may occur in bonding of semiconductor substrates according to a comparative example.

FIG. 18 is a schematic cross-sectional view illustrating that a void 14V is generated in a first semiconductor substrate 100R according to a comparative example. FIG. 19 is a schematic cross-sectional view illustrating copper (Cu) contamination that may occur in bonding of semiconductor substrates 10-1 and 20-1 according to a comparative example.

Referring to FIG. 18, a dent 130-G that is remaining in the process of removing a portion of a first liner 13 that surrounds an end portion of a first through via through wet etching may cause the void 14V in the process of depositing a first diffusion barrier layer 14L. The generated void 14V may act as a cause of copper (Cu) contamination in a semiconductor device 10R-1, as illustrated in FIG. 19. When the semiconductor device 10R-1 is configured by directly bonding the second semiconductor substrate 20-1 to the first semiconductor substrate 10-1, the void 14L may provide a passage through which copper (Cu) components or copper (Cu) ions constituting a conductive pad 25 of the second semiconductor substrate 20-1 are diffused. The void 14L may be positioned on a side surface of the end portion 120E of the through via 12 of the first semiconductor substrate 10-1 and may be connected to a bottom surface 25B of the conductive pad 25 coupled to the through via 12. Accordingly, the copper (Cu) components of the conductive pad 25 may be diffused into a first semiconductor substrate body 110 through the void 14L.

Referring to FIGS. 14 and 15, in the process of second recessing the first semiconductor substrate body 110, as the height H1 of the second recessed first top surface 110T becomes lower than the height of the first recessed first top surface 110T-M, the shape of the dent (130-G in FIG. 14) may be removed. Accordingly, it is possible to prevent the occurrence of the void 14V as illustrated in FIG. 18, in advance. Accordingly, as illustrated in FIG. 1, when the second semiconductor substrate 200 is directly bonded to the first semiconductor substrate 100, the diffusion of copper (Cu) components or copper (Cu) ions through the void 14V may be blocked.

Figure 20:
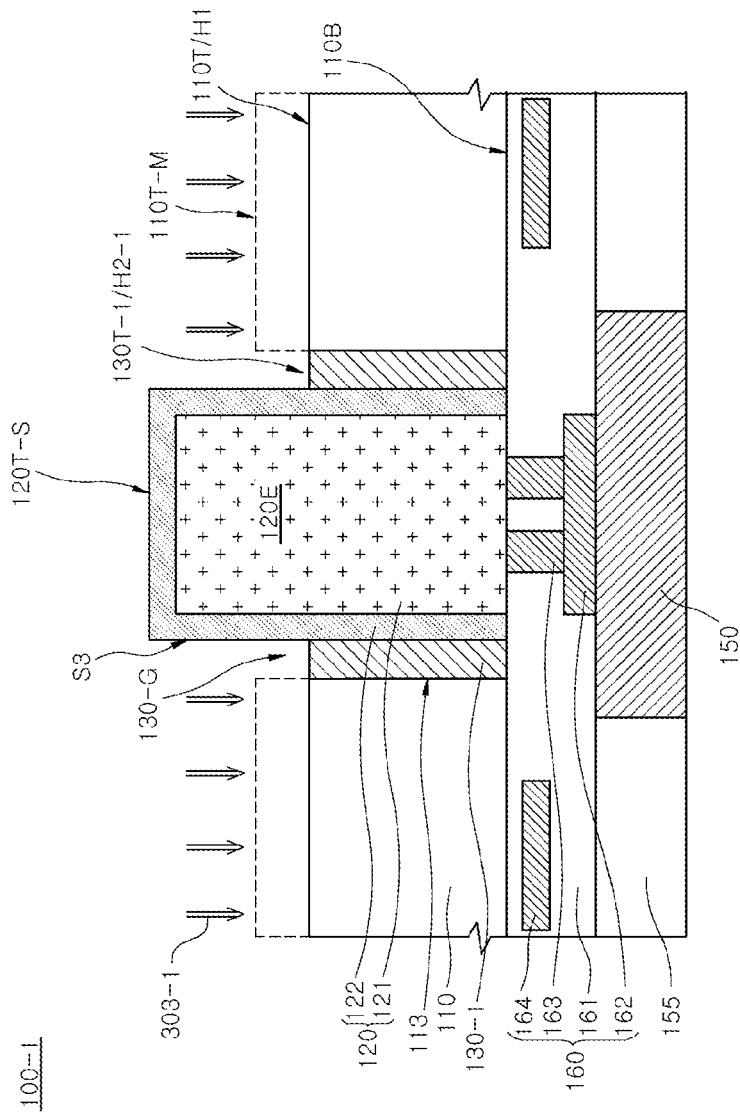
FIGS. 20 and 21 are schematic cross-sectional views illustrating a method of fabricating a semiconductor device according to another embodiment of the present disclosure.
Figure 21:
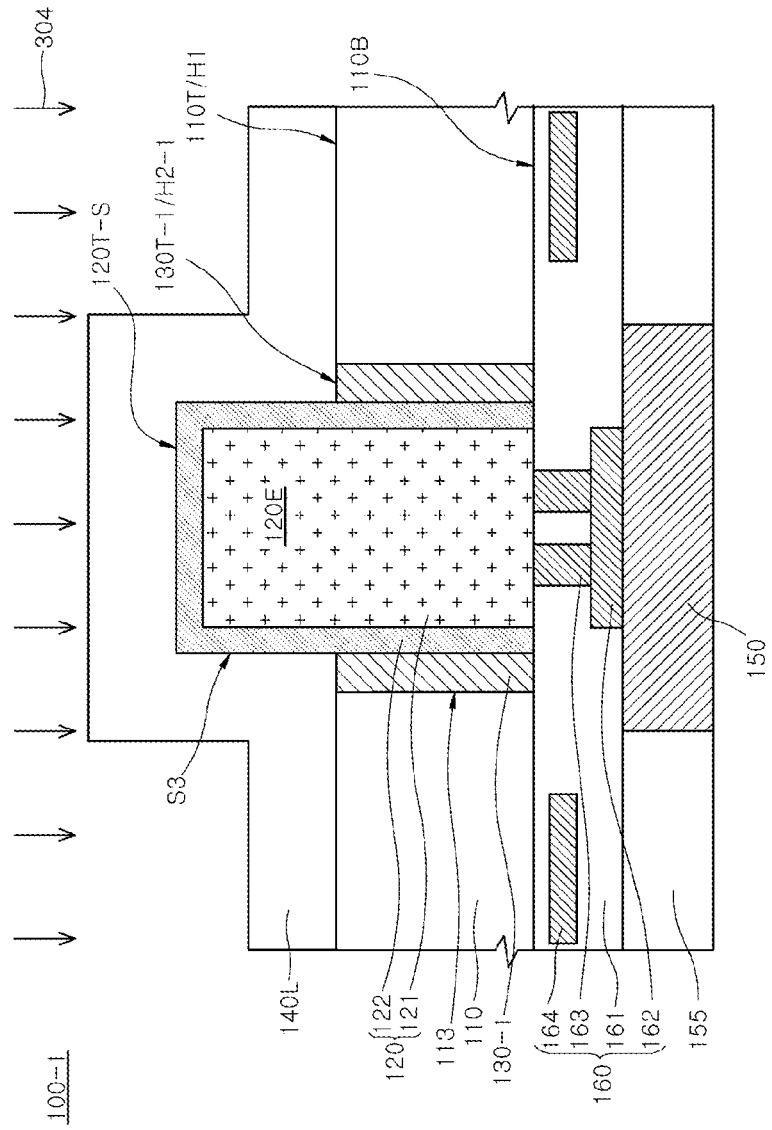

FIGS. 20 and 21 are schematic cross-sectional views illustrating a method of fabricating a semiconductor device according to another embodiment of the present disclosure. FIGS. 20 and 21 may schematically illustrate processes of forming the first semiconductor substrate 100-1 of FIG. 6. In FIGS. 20 and 21, the same reference numerals as in FIGS. 6 and 14 may indicate the same elements. In FIGS. 20 and 21, elements presented in substantially the same shapes or similar shapes as those of FIGS. 6 and 14 may indicate the same elements.

Referring to FIGS. 14 and 20, while removing (302) the portion 130-R of the first liner 130 or 130-1 that surrounds the end portion 120E of the first through via 120, the dent 130-G may be generated. The first semiconductor substrate body 110 may be second recessed (303-1) to lower the height of the first recessed first top surface 110T-M to the height of the second recessed first top surface 110T. In this case, the first semiconductor substrate body 110 may be second recessed (303-1) so that the height H1 of the second recessed first top surface 110T of the first semiconductor substrate body 110 becomes substantially equal to the height H2-1 of the third top surface 130T-1 of the first liner 130-1 or has substantially the same height as the third top surface 130T-1 of the first liner 130-1.

Referring to FIG. 21, a first diffusion barrier layer 140L may be formed. The first diffusion barrier layer 140L may extend to cover the second recessed first top surface 110T of the first semiconductor substrate body 110 and the third top surface 130T-1 of the first liner 130-1 and cover the second top surface 120T-S and the portion S3 of the side surface of the end portion 120E of the first through via 120. Thereafter, the first diffusion barrier layer 140L may be planarized (304). The second semiconductor substrate 200-1 of FIG. 5 may be directly bonded to the first semiconductor substrate 100-1 formed as described above, thereby forming the semiconductor device (10-1 of FIG. 5).

Figure 22:
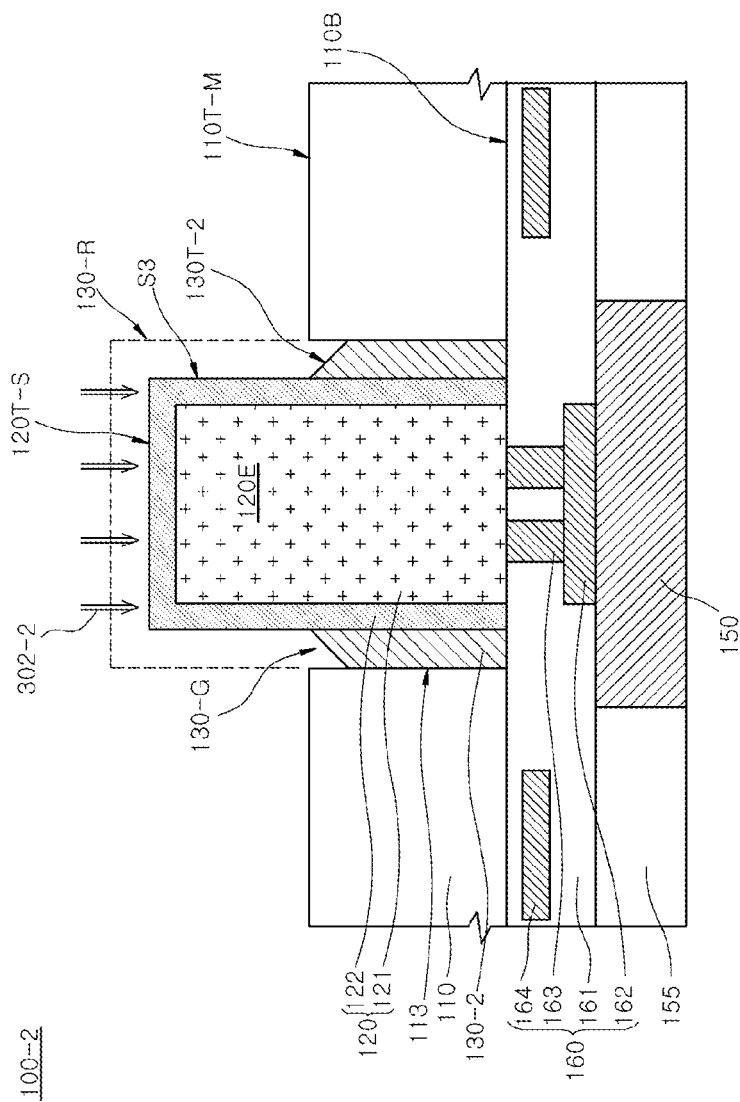
FIGS. 22 to 24 are schematic cross-sectional views illustrating a method of fabricating a semiconductor device according to another embodiment of the present disclosure.
Figure 23:
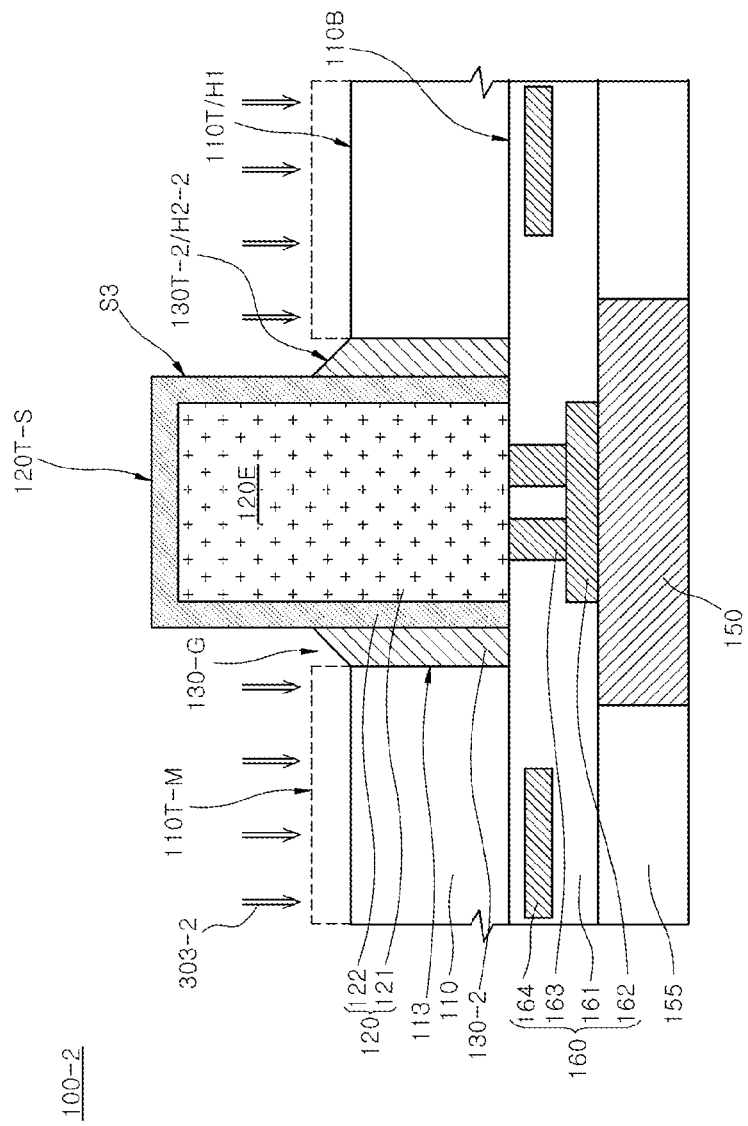
Figure 24:
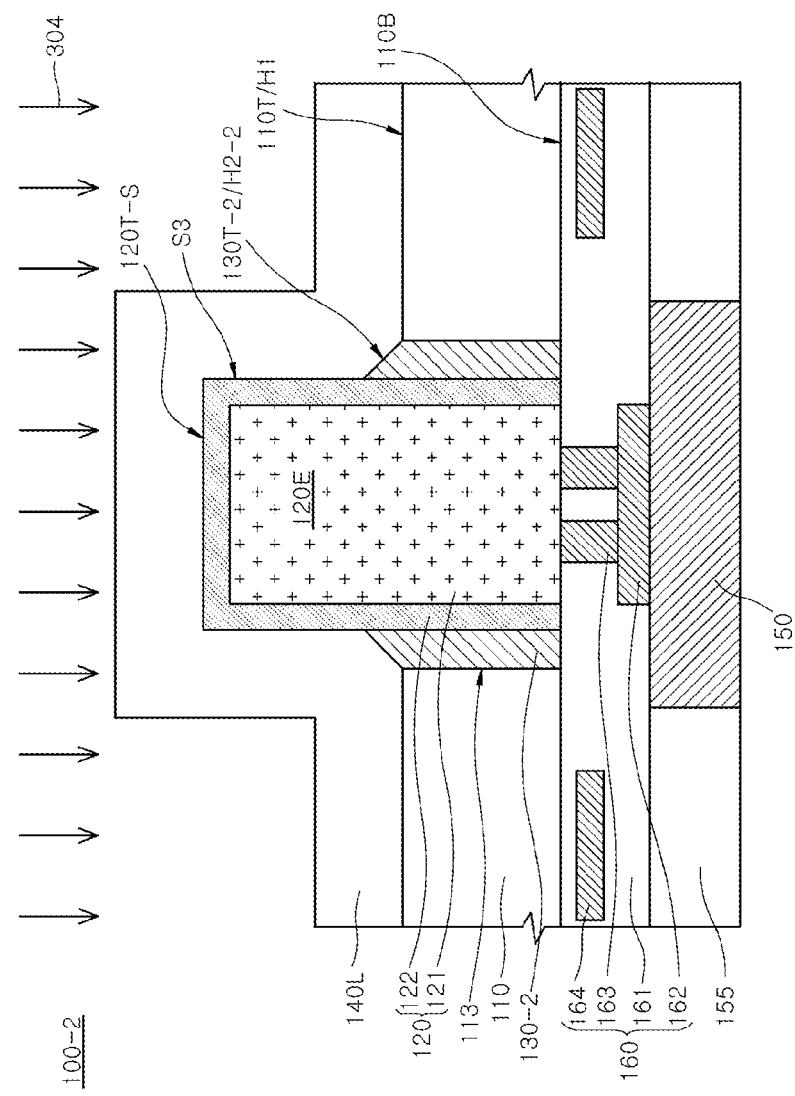

FIGS. 22 to 24 are schematic cross-sectional views illustrating a method of fabricating a semiconductor device according to another embodiment of the present disclosure. FIGS. 22 to 24 may schematically illustrate processes of forming the first semiconductor substrate 100-2 of FIG. 8. In FIGS. 22 to 24, the same reference numerals as in FIGS. 8, 14, and 20 may indicate the same elements. In FIGS. 22 to 24, elements presented in substantially the same shapes or similar shapes as those of FIGS. 8, 14, and 20 may indicate the same elements.

Referring to FIG. 22, while removing (302-2) a portion 130-R of the first liner 130-2 that surrounds the end portion 120E of the first through via 120 of the first semiconductor substrate 100-2, a dent 130-G may be generated. In this case, when the portion 130-R of the first liner 130-2 is removed (302-2), it is possible to induce the third top surface 130T-2 of the first liner 130-2 to have an inclined surface by adjusting the degree of anisotropic etching.

Referring to FIG. 23, the first semiconductor substrate body 110 may be second recessed (303-2) to lower the height of the first recessed first top surface 110T-M to the height of the second recessed first top surface 110T. In this case, the second recessing (303-2) may be performed such that the height H2-2 of the third top surface 130T-1 of the first liner 130-2 becomes higher than the height H1 of the second recessed first top surface 110T of the first semiconductor substrate body 110 or becomes lower than the height of the second top surface 120T-S of the end portion 120E of the first through via 120.

Referring to FIG. 24, the first diffusion barrier layer 140L may be formed. The first diffusion barrier layer 140L may extend to cover the second recessed first top surface 110T of the first semiconductor substrate body 110 and the third top surface 130T-2 of the first liner 130-2 and cover the second top surface 120T-S and a portion S3 of the side surface of the end portion 120E of the first through via 120. Thereafter, the first diffusion barrier layer 140L may be planarized (304). The second semiconductor substrate (200-2 of FIG. 7) may be directly bonded to the first semiconductor substrate 100-2 formed as described above, thereby forming the semiconductor device (10-2 of FIG. 7).

Figure 25:
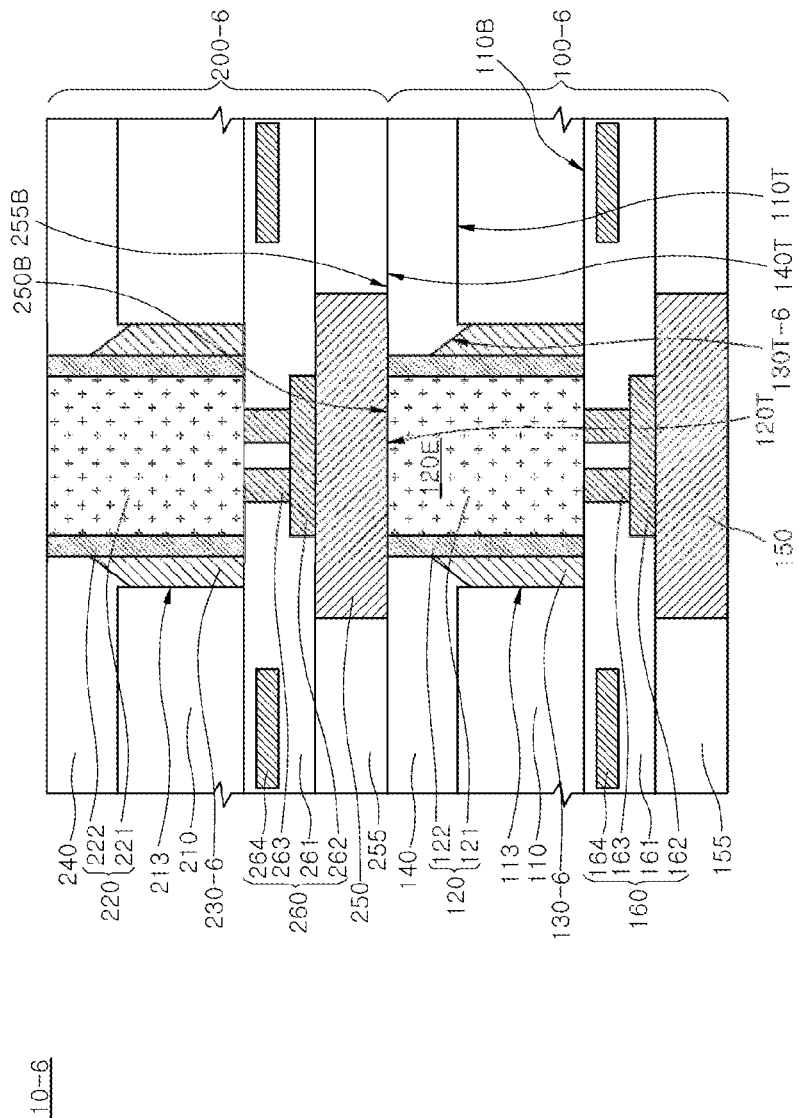
FIGS. 25 and 26 are schematic cross-sectional views illustrating a semiconductor device according to another embodiment of the present disclosure.
Figure 26:
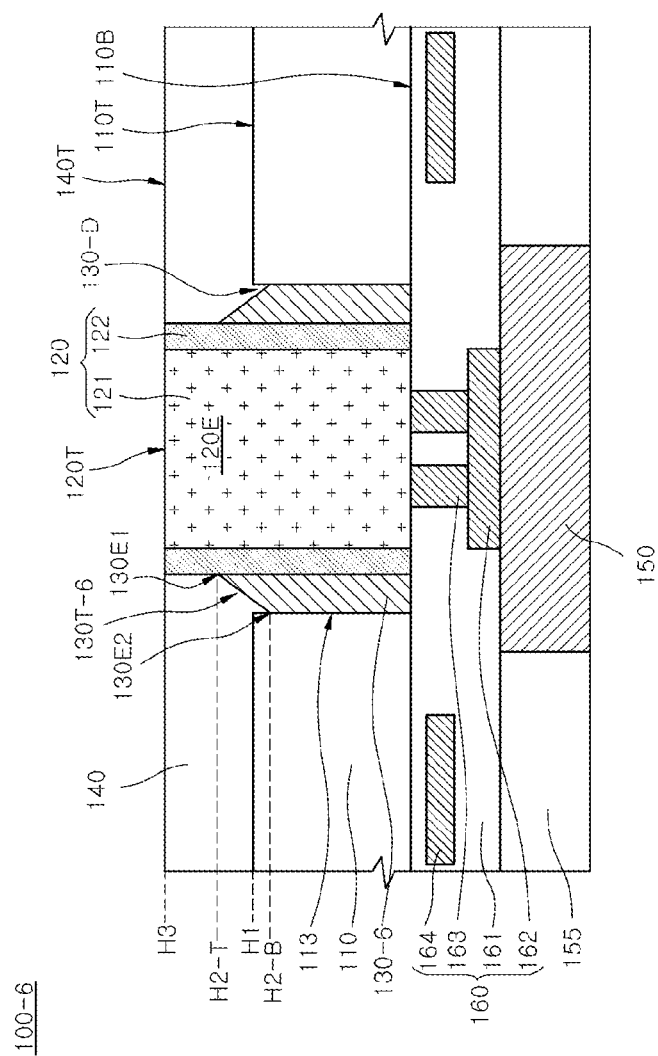

FIGS. 25 and 26 are schematic cross-sectional views illustrating a semiconductor device 10-6 according to another embodiment of the present disclosure. FIG. 26 is a schematic cross-sectional view illustrating a first semiconductor substrate 100-6 of the semiconductor device 10-6 of FIG. 25. In FIGS. 25 and 26, the same reference numerals as in FIGS. 7 and 8 or FIGS. 1 to 3 may indicate the same elements. In FIGS. 25 and 26, elements presented in substantially the same shapes or similar shapes as those of FIGS. 7 and 8 or FIGS. 1 to 3 may indicate the same elements.

Referring to FIGS. 25 and 26, the semiconductor device 10-6 may include the first semiconductor substrate 100-6 and a second semiconductor substrate 200-6. The second semiconductor substrate 200-6 may be directly bonded to the first semiconductor substrate 100-6. The first semiconductor substrate 100-6 may include a first semiconductor substrate body 110, a first through via 120, a first liner 130-6, and a first diffusion barrier layer 140. The first semiconductor substrate 100-6 may further include a first multilevel interconnection structure 160, a first conductive pad 150, and a third diffusion barrier layer 155. The second semiconductor substrate 200-6 may include at least a second liner 230-6, a second conductive pad 250, and a second diffusion barrier layer 255. The second semiconductor substrate 200-6 may include substantially the same elements as the first semiconductor substrate 100-6.

The first liner 130-6 may extend to expose an upper side of an end portion 120E of the first through via 120 and cover a lower side of the end portion 120E. The first liner 130-6 may be disposed to have an inclined third top surface 130T-6 that is lower than a second top surface 120T of the end portion 120E of the first through via 120. The inclined third top surface 130T-6 of the first liner 130-6 may be an inclined surface with a first edge portion 130E1 and an opposite second edge portion 130E2. The first edge portion 130E1 of the inclined third top surface 130T-6 of the first liner 130-6 may be positioned at a height H2-T that is higher than that of the first top surface 110T of the first semiconductor substrate body 110, and the second edge portion 130E2 may be positioned at a height H2-B that is lower than that of the first top surface 110T of the first semiconductor substrate body 110. The inclined third top surface 130T-6 of the first liner 130-6 may be inclined so that the first edge portion 130E1 is positioned closer to the end portion 120E of the first through via 120 than the second edge portion 130E2.

As the second edge portion 130E2 of the inclined third top surface 130T-6 of the first liner 130-6 is positioned at the lower height H2-B that is lower than the first top surface 110T of the first semiconductor substrate body 110, the second edge portion 130E2 of the inclined third top surface 130T-6 may form a step difference with the first top surface 110T of the first semiconductor substrate body 110, and a concave dent 130-D may be formed between the second edge portion 130E2 of the inclined third top surface 130T-6 and the first semiconductor substrate body 110 due to the step difference. The first diffusion barrier layer 140 may extend to fill the concave dent 130-D. The first liner 130-6 may have the inclined third top surface 130T-6, and the first diffusion barrier layer 140 may fill the concave dent 130-D without generating voids.

Some portions of the first diffusion barrier layer 140 may cover and shield the third top surface 130T-6 of the first liner 130-6. Accordingly, the first liner 130-6 may be isolated from the second bottom surface 250B of the second conductive pad 250 of the second semiconductor substrate 200-6 due to the first diffusion barrier layer 140. It is possible to effectively block the diffusion of copper (Cu) ions or copper (Cu) components constituting the second conductive pad 250 into the first semiconductor substrate 100-6 through the first liner 130-6.

Figure 27:
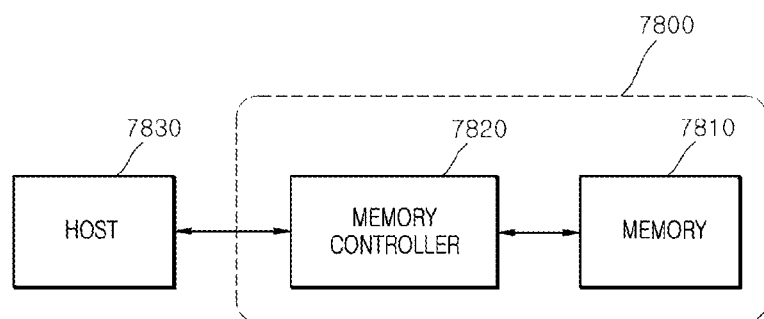
FIG. 27 is a block diagram illustrating an electronic system employing a memory card including a package according to an embodiment of the present disclosure.

FIG. 27 is a block diagram illustrating an electronic system including a memory card 7800 employing at least one of the semiconductor packages according to the embodiments. The memory card 7800 includes a memory 7810 such as a nonvolatile memory device, and a memory controller 7820. The memory 7810 and the memory controller 7820 may store data or read out the stored data. At least one of the memory 7810 and the memory controller 7820 may include at least one of the semiconductor packages according to the embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 28:
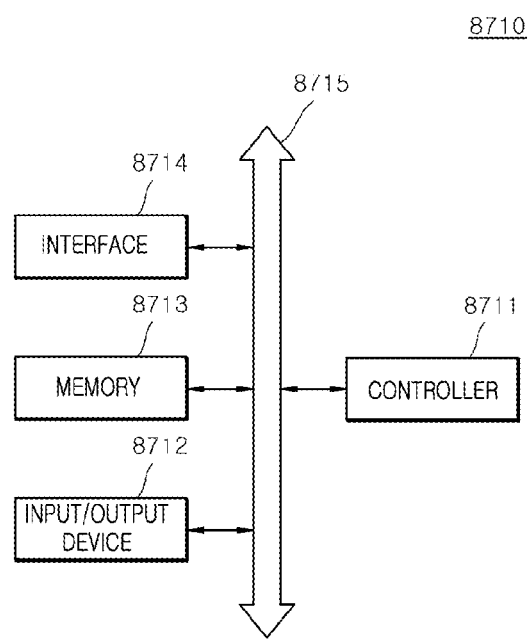
FIG. 28 is a block diagram illustrating an electronic system including a package according to an embodiment of the present disclosure.

FIG. 28 is a block diagram illustrating an electronic system 8710 including at least one of the semiconductor packages according to the embodiments. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include at least one of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed based on the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system by using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution) or Wibro (wireless broadband Internet).

The inventive concept has been disclosed in conjunction with some embodiments as described above. Those skilled in the art will appreciate that various modifications, additions and substitutions are possible, without departing from the scope and spirit of the present disclosure. Accordingly, the embodiments disclosed in the present specification should be considered from not a restrictive standpoint but an illustrative standpoint. The scope of the inventive concept is not limited to the above descriptions but defined by the accompanying claims, and all of distinctive features in the equivalent scope should be construed as being included in the inventive concept.

What is claimed is:

1. A semiconductor device comprising:
   a first semiconductor substrate; and
   a second semiconductor substrate directly bonded to the first semiconductor substrate,
   wherein the first semiconductor substrate comprises:
   a first semiconductor substrate body;
   a first through via with an end portion protruding through a first top surface, the first top surface being a top surface of the first semiconductor substrate body;
   a liner formed at an interface between the first through via and the first semiconductor substrate body and extending to partially expose a side surface of the end portion of the first through via; and
   a first diffusion barrier layer covering the first top surface of the first semiconductor substrate body and covering the side surface of the end portion of the first through via, and
   wherein the liner comprises a third top surface that is positioned at a lower position than a second top surface, the second top surface being a top surface of the end portion of the first through via, and substantially equal to or at a higher position than the first top surface, and wherein the first diffusion barrier layer is extended to cover the third top surface of the liner.

2. The semiconductor device of claim 1, wherein the third top surface has a step difference from the first top surface to form a step shape.

3. The semiconductor device of claim 1, wherein the third top surface is an inclined surface.

4. The semiconductor device of claim 1, wherein the first diffusion barrier layer extends to cover the third top surface.

5. The semiconductor device of claim 1, wherein the liner comprises a silicon oxide ($SiO_2$) layer, and
   wherein the first diffusion barrier layer comprises a silicon nitride ($Si_3N_4$) layer.

6. The semiconductor device of claim 1, wherein the first through via substantially penetrates the first semiconductor substrate body and the first diffusion barrier layer.

7. The semiconductor device of claim 1, wherein the first through via comprises:
   a through via body including copper (Cu); and
   a side barrier layer, including a tantalum (Ta) layer or tantalum nitride (TaN) layer, covering a side surface of the through via body.

8. The semiconductor device of claim 1, wherein the second semiconductor substrate comprises:
   a conductive pad, including copper (Cu), directly bonded to the first through via; and
   a second diffusion barrier layer directly bonded to the first diffusion barrier layer.

9. The semiconductor device of claim 8, wherein the conductive pad has a wider width than the first through via.

10. The semiconductor device of claim 8, wherein the conductive pad has a narrower width than the first through via.

11. The semiconductor device of claim 8, wherein the second diffusion barrier layer includes a silicon nitride ($Si_3N_4$) layer.

12. The semiconductor device of claim 8, wherein the second semiconductor substrate further comprises a second through via electrically connected to the conductive pad.

13. The semiconductor device of claim 1, wherein the second semiconductor substrate comprises substantially the same elements as the first semiconductor substrate.

14. A method of fabricating a semiconductor device, the method comprising:
   forming a first through via that is surrounded by a liner in a first semiconductor substrate body;
   first recessing the first semiconductor substrate body to allow an end portion of the first through via to protrude from a first recessed top surface of the first semiconductor substrate body while being covered by the liner;
   removing a portion of the liner that surrounds the end portion of the first through via to expose a portion of a side surface and second top surface of the end portion of the first through via;
   second recessing the first top surface of the first semiconductor substrate body;
   forming a first diffusion barrier layer that covers the second recessed first top surface of the first semiconductor substrate body and exposing the second top surface of the end portion of the first through via; and
   directly bonding a second semiconductor substrate to the first diffusion barrier layer and the second top surface of the end portion of the first through via.

15. The method of claim 14, wherein second recessing the first top surface of the first semiconductor substrate body is performed such that the liner includes a third top surface that is positioned at a height that is lower than the second top surface of the end portion of the first through via and higher than the second recessed first top surface of the first semiconductor substrate body.

16. The method of claim 14, wherein second recessing the first top surface of the first semiconductor substrate body is performed such that the liner includes a third top surface that is positioned at a height that is lower than the second top surface of the end portion of the first through via and substantially equal to the second recessed first top surface of the first semiconductor substrate body.

17. The method of claim 14, wherein removing the portion of the liner that surrounds the end portion of the first through via is performed such that the liner includes a third top surface with an inclined surface.

18. The method of claim 14, wherein removing the portion of the liner that surrounds the end portion of the first through via accompanies a dent between the first recessed first top surface of the first semiconductor substrate body and the side surface of the end portion of the first through via.

19. The method of claim 14, wherein forming the first diffusion barrier layer comprises:
    forming the first diffusion barrier layer to cover the second recessed first top surface of the first semiconductor substrate body and cover the end portion of the first through via; and
    performing chemical mechanical polishing (CMP) on the first diffusion barrier layer to expose the second top surface of the end portion of the first through via.

20. The method of claim 14, wherein the second semiconductor substrate comprises:
    a conductive pad, including copper (Cu), directly bonded to the first through via; and
    a second diffusion barrier layer directly bonded to the first diffusion barrier layer.

21. A semiconductor device comprising:
    a first semiconductor substrate; and
    a second semiconductor substrate directly bonded to the first semiconductor substrate, wherein the first semiconductor substrate comprises:
        a first semiconductor substrate body;
        a first through via with an end portion protruding through a first top surface, the first top surface being a top surface of the first semiconductor substrate body;
        a liner disposed at an interface between the first through via and the first semiconductor substrate body and extending to partially expose a side surface of the end portion of the first through via; and
        a first diffusion barrier layer covering the first top surface of the semiconductor substrate body and covering the side surface of the end portion of the first through via,
        wherein the liner comprises an inclined third top surface that is positioned at a lower position than a second top surface, the second top surface being a top surface of the end portion of the first through via, and
        wherein the inclined third top surface comprises a first edge portion positioned at a higher position than the first top surface of the first semiconductor substrate body and a second edge portion, opposite to the first edge portion, positioned at a lower position than the first top surface of the first semiconductor substrate body.

22. The semiconductor device of claim 21, wherein the second edge portion of the inclined third top surface is positioned closer to the end portion of the first through via than the second edge portion.

23. The semiconductor device of claim 21, wherein the second edge portion of the inclined third top surface forms a concave dent based on a step difference with the first top surface, and
    wherein the first diffusion barrier layer extends to fill the concave dent.

24. The semiconductor device of claim 23, wherein the second semiconductor substrate comprises:
    a conductive pad, including copper (Cu), directly bonded to the first through via; and
    a second diffusion barrier layer directly bonded to the first diffusion barrier layer.

* * * * *